United States Patent [19]
Daughton et al.

[11] Patent Number: 6,072,382
[45] Date of Patent: Jun. 6, 2000

[54] SPIN DEPENDENT TUNNELING SENSOR

[75] Inventors: James M. Daughton, Eden Prairie; Mark C. Tondra, Minneapolis, both of Minn.; Arthur V. Pohm, Ames, Iowa

[73] Assignee: Nonvolatile Electronics, Incorporated, Eden Prairie, Minn.

[21] Appl. No.: 09/226,460

[22] Filed: Jan. 6, 1999

Related U.S. Application Data

[60] Provisional application No. 60/070,519, Jan. 6, 1998.

[51] Int. Cl.$^7$ .................................................. H01L 43/00
[52] U.S. Cl. ......................................... 338/32 R; 360/113
[58] Field of Search .............................. 338/32 R, 32 H; 360/113; 73/862.336, 862.333, 862.335

[56] References Cited

U.S. PATENT DOCUMENTS

| | | |
|---|---|---|
| 4,385,283 | 5/1983 | Delapierre ............................ 340/52 R |
| 5,159,513 | 10/1992 | Dieny et al. . |
| 5,206,590 | 4/1993 | Dieny et al. . |
| 5,351,005 | 9/1994 | Rouse et al. ............................ 324/252 |
| 5,408,377 | 4/1995 | Gurney et al. . |
| 5,465,185 | 11/1995 | Helm et al. . |
| 5,520,059 | 5/1996 | Garshelis ............................ 73/862.335 |
| 5,561,368 | 10/1996 | Dovek et al. ............................ 324/252 |
| 5,629,922 | 5/1997 | Moodera et al. . |
| 5,640,343 | 6/1997 | Gallagher et al. . |
| 5,650,958 | 7/1997 | Gallagher et al. . |

*Primary Examiner*—Lincoln Donovan
*Assistant Examiner*—Richard K. Lee
*Attorney, Agent, or Firm*—Kinney & Lange, P.A.

[57] ABSTRACT

A magnetic field sensor having a junction structure in a sensor cell using a dielectric intermediate separating material with two major surfaces on one of which is a base anisotropic ferromagnetic thin-film which is also on a base electrode, and on the other of which there is at least one of a plurality of separate anisotropic ferromagnetic thin-film but of differing rotational responses to external magnetic fields. Similar structures have a separated film in each that can be interconnected to one another with the interconnections extending at least in part substantially parallel to the widths of the separated films, and the separated films can have lengths with gradually narrowing widths to the ends thereof as can the base electrode. One or more planar coils can be supported at least in part on the separated films.

25 Claims, 11 Drawing Sheets

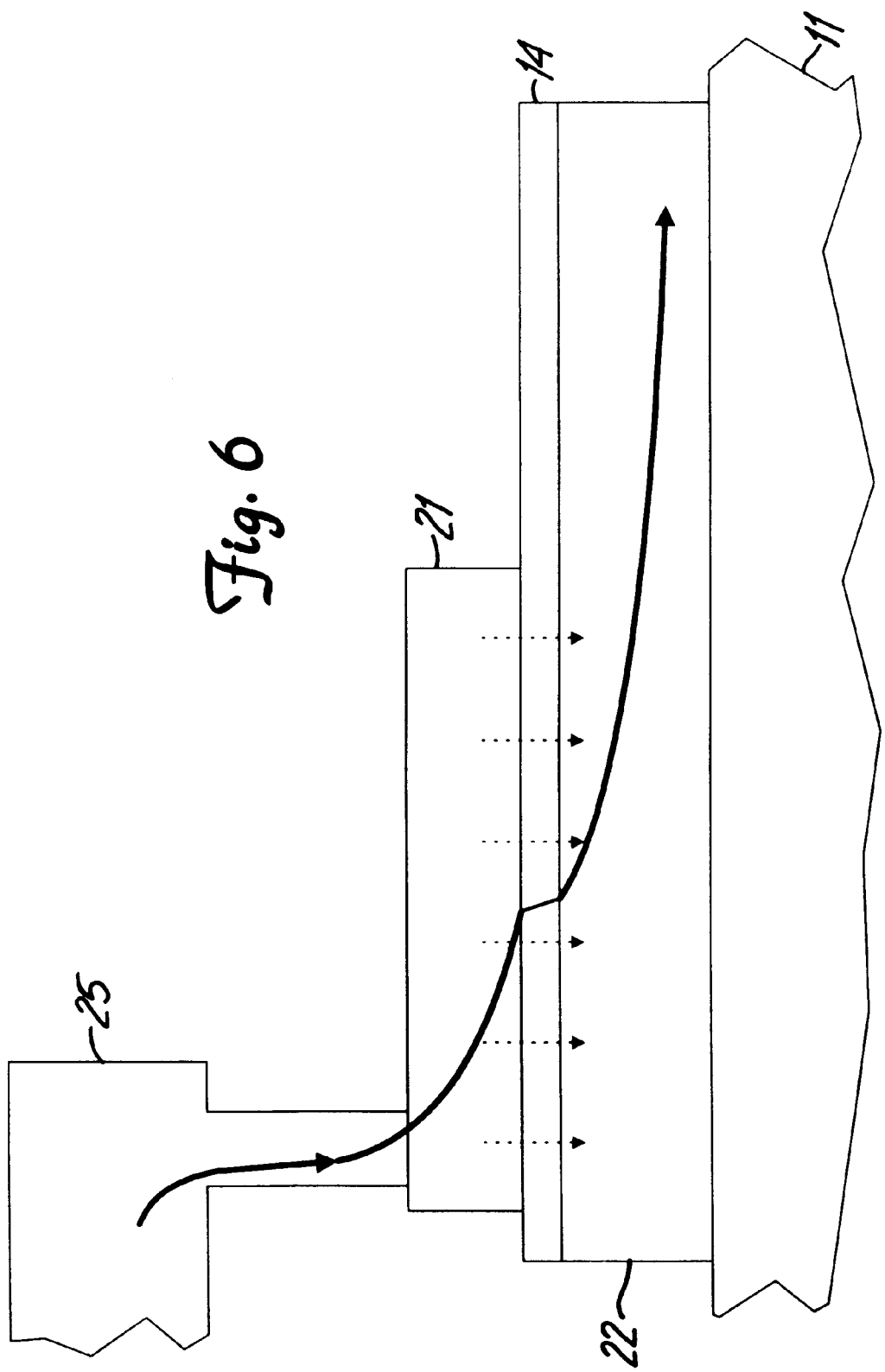

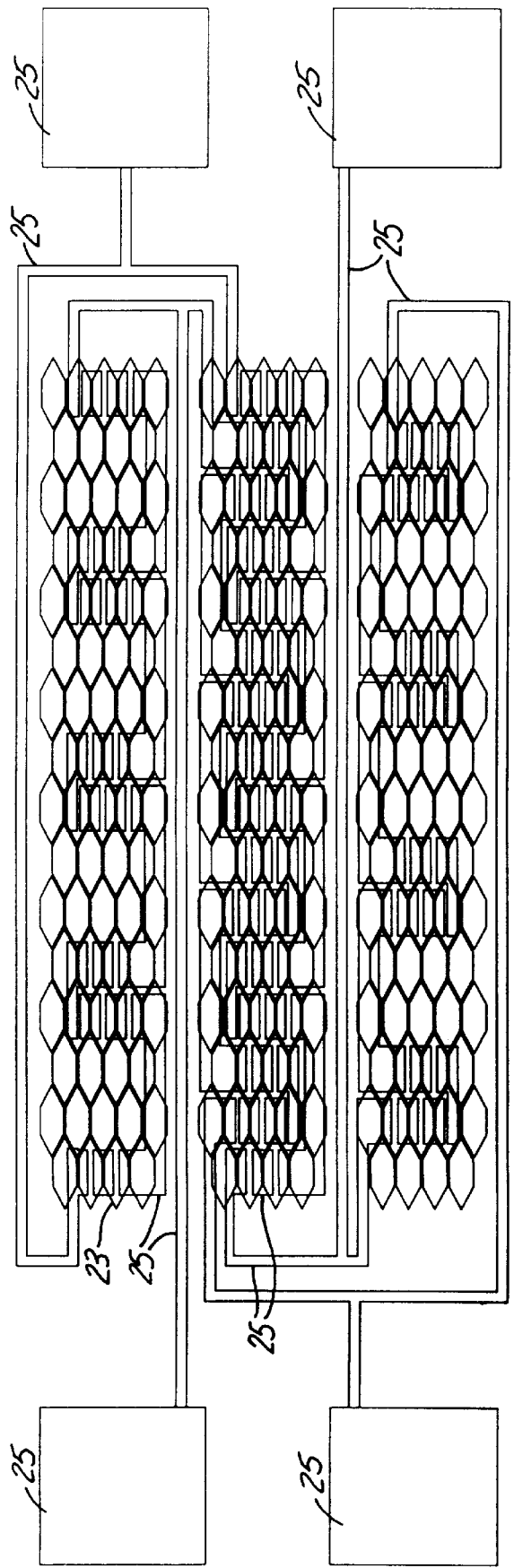

SPIN DEPENDENT TUNNELING SENSOR

CROSS-REFERENCE TO RELATED APPLICATION

This application claims priority from Provisional Application Ser. No. 60/070,519, filed Jan. 6, 1998, entitled "Spin Dependent Tunneling Sensor".

BACKGROUND OF THE INVENTION

The present invention relates to ferromagnetic thin-film structures and, more particularly, to ferromagnetic thin-film structures exhibiting relatively large magnetoresistive characteristics.

Many kinds of electronic systems make use of magnetic devices. Digital memories are used extensively in digital systems of many kinds including computers and computer systems components, and digital signal processing systems. Such memories can be advantageously based on the storage of digital bits as alternative states of magnetization in magnetic materials in each memory cell, particularly in cells using thin-film magnetic materials, resulting in memories which use less electrical power and do not lose information upon removals of such electrical power.

Magnetometers and other magnetic sensing devices are also used extensively in many kinds of systems including magnetic disk memories and magnetic tape storage systems of various kinds. Such devices provide output signals representing the magnetic fields sensed thereby in a variety of situations.

Such memory cells and sensors can often be advantageously fabricated using ferromagnetic thin-film materials, and are often based on magnetoresistive sensing of magnetic states, or magnetic conditions, therein. Such devices may be provided on a surface of a monolithic integrated circuit to provide convenient electrical interconnections between the device and the operating circuitry therefor.

In the recent past, reducing the thicknesses of the ferromagnetic thin-films and the intermediate layers in extended "sandwich" structures in which the two major surfaces of the intermediate each have thereon an anisotropic ferromagnetic thin-film layer, including those having additional alternating ones of such films and layers, i.e. superlattices, have been shown to lead to a "giant magnetoresistive effect" being present. This effect yields a magnetoresistive response which can be in the range of up to an order of magnitude greater than that due to the well-known anisotropic magnetoresistive response.

In the ordinary anisotropic magnetoresistive response, varying differences between the direction of the magnetization vector in the ferromagnetic film and the direction of the sensing current passed through the film lead to varying differences in the effective electrical resistance in the direction of the current. The maximum electrical resistance occurs when the magnetization vector in the film and the current direction are parallel to one another, while the minimum resistance occurs when they are perpendicular to one another. The total electrical resistance in such a magnetoresistive ferromagnetic film can be shown to be given by a constant value, representing the minimum resistance, plus an additional value depending on the angle between the current direction in the film and the magnetization vector therein. This additional resistance follows a square of the cosine of that angle.

As a result, operating external magnetic fields can be used to vary the angle of the magnetization vector in such a film portion with respect to the easy axis of that film portion which comes about because of an anisotropy therein typically resulting from depositing the film in the presence of a fabrication external magnetic field oriented in the plane of the film along the direction desired for the easy axis in the resulting film. During subsequent operation of the device with the resulting film, such operating external magnetic fields can vary the angle to such an extent as to cause switching of the film magnetization vector between two stable states which occur as magnetizations oriented in opposite directions along that easy axis. The state of the magnetization vector in such a film portion can be measured, or sensed, by the change in resistance encountered by current directed through this film portion. This arrangement has provided the basis for a ferromagnetic, magnetoresistive anisotropic thin-film to serve as part of a memory cell.

In contrast to this arrangement, the resistance in the plane of a ferromagnetic thin-film is isotropic with respect to the giant magnetoresistive effect rather than depending on the direction of a sensing current therethrough as for the anisotropic magnetoresistive effect. The giant magnetoresistive effect has a magnetization dependent component of resistance that varies as the cosine of the angle between magnetizations in the two ferromagnetic thin-films on either side of an intermediate layer. In the giant magnetoresistive effect, the electrical resistance through the "sandwich" or superlattice is lower if the magnetizations in the two separated ferromagnetic thin-films are parallel than it is if these magnetizations are antiparallel, i.e. directed in opposing directions. Further, the anisotropic magnetoresistive effect in very thin-films is considerably reduced from the bulk values therefor in thicker films due to surface scattering, whereas very thin-films are a fundamental requirement to obtain a significant giant magnetoresistive effect.

In addition, as indicated, the giant magnetoresistive effect can be increased by adding further alternate intermediate and ferromagnetic thin-film layers to extend the "sandwich" or superlattice structure. The giant magnetoresistive effect is sometimes called the "spin valve effect" in view of the explanation that a larger fraction of conduction electrons are allowed to move more freely from one ferromagnetic thin-film layer to another if the magnetizations in these layers are parallel than if they are antiparallel with the result that the magnetization states of the layers act as sort of a valve.

These magnetizations results often come about because of magnetic exchange coupling between the ferromagnetic thin-films separated by the intermediate layers, these intermediate layers typically formed from a nonferromagnetic transition metal. The effect of the exchange coupling between the ferromagnetic thin-film layers is determined to a substantial degree by the thickness of such an intermediate layer therebetween. The effect of the coupling between the separated ferromagnetic thin-film layers has been found to oscillate as a function of this separation thickness between these layers in being ferromagnetic coupling (such that the magnetizations of the separated layers are parallel to one another) and antiferromagnetic coupling (such that the magnetizations of the separated layers are opposed to one another, or antiparallel to one another). Thus, for some separation thicknesses, the layer coupling can be of zero value between extremes of such oscillations.

Exhibiting the giant magnetoresistive effect in a superlattice structure, or in an abbreviated superlattice structure formed by a three layer "sandwich" structure, requires that there be arrangements in connection therewith that permit the establishment alternatively of both parallel and antiparallel orientations of the magnetizations in the alternate ferromagnetic thin-film layers therein. One such arrangement is to have the separated ferromagnetic thin-films in the multilayer structure be antiferromagnetically coupled but to a sufficiently small degree so that the coupling field can be overcome by an external magnetic field.

Another arrangement is to form the ferromagnetic thin-film layers with alternating high and low coercivity materials so that the magnetization of the low coercivity material layers can be reversed without reversing the magnetizations of the others. A further alternative arrangement is to provide "soft" ferromagnetic thin-films and exchange couple every other one of them with an adjacent magnetically hard layer (forming a ferromagnetic thin-film double layer) so that the ferromagnetic double layer will be relatively unaffected by externally applied magnetic fields even though the magnetizations of the other ferromagnetic thin-film layers will be subject to being controlled by such an external field.

One further alternative arrangement, related to the first, is to provide such a multilayer structure that is, however, etched into strips such that demagnetizing effects and currents in such a strip can be used to orient the magnetizations antiparallel, and so that externally applied magnetic fields can orient the magnetizations parallel. Thus, parallel and antiparallel magnetizations can be established in the ferromagnetic thin-films of the structure as desired in a particular use. Such a structure must be fabricated so that any ferromagnetic or antiferromagnetic coupling between separated ferromagnetic films is not too strong so as to prevent such establishments of film magnetizations using practical interconnection arrangements.

A magnetic field sensor suited for fabrication with dimensions of a few microns or less can be fabricated that provides a suitable response to the presence of very small external magnetic fields and low power dissipation by substituting an electrical insulator for a conductor in the nonmagnetic layer. This sensor can be fabricated using ferromagnetic thin-film materials of similar or different kinds in each of the outer magnetic films provided in a "sandwich" structure on either side of an intermediate nonmagnetic layer which ferromagnetic films may be composite films, but this insulating intermediate nonmagnetic layer conducts electrical current therethrough based primarily on a quantum electrodynamic effect "tunneling" current.

This "tunneling" current has a magnitude dependence on the angle between the magnetization vectors in each of the ferromagnetic layers on either side of the intermediate layer due to the transmission barrier provided by this intermediate layer depending on the degree of matching of the spin polarizations of the electrons tunneling therethrough with the spin polarizations of the conduction electrons in the ferromagnetic layers, the latter being set by the layer magnetization directions to provide a "magnetic valve effect". Such an effect results in an effective resistance, or conductance, characterizing this intermediate layer with respect to the "tunneling" current therethrough. The maximum fractional change in effective resistance is a function of the magnetic polarization of the conduction electrons given by $$(\Delta R/R) = 2P_1 P_2 / (1 + P_1 P_2)$$

where $P_1$ and $P_2$ are the conduction electron spin polarizations of the two ferromagnetic layers. These polarizations appear dependent on the ratio of spin up to spin down electrons in the 3D shell of the transition elements used in the ferromagnetic thin-films, i.e. the spin polarization P of the conduction electrons. The fraction f of 3D electrons which are spin up have typical values of 0.75 for iron, 0.64 for cobalt and 0.56 for nickel. Conduction electrons in metals are normally S shell electrons which theoretically would be equally divided between spin up and spin down electrons. However, because of band splitting the conduction electrons in the magnetic layers are assumed to have a fraction of spin up electrons like that of the electrons in the 3D shell. The spin polarization is then determined from $P = 2f - 1$.

In addition, shape anisotropy is often used in such a sensor to provide different coercivities in the two ferromagnetic layers, and by forming one of the ferromagnetic layers to be thicker than the other. Such devices may be provided on a surface of a monolithic integrated circuit to thereby allow providing convenient electrical connections between each such sensor device and the operating circuitry therefor.

A "sandwich" structure for such a sensor, based on having an intermediate thin layer of a nonmagnetic, dielectric separating material with two major surfaces on each of which a anisotropic ferromagnetic thin-film is positioned, exhibits the "magnetic valve effect" if the materials for the ferromagnetic thin-films and the intermediate layers are properly selected and have sufficiently small thicknesses. The resulting "magnetic valve effect" can yield a response which can be several times in magnitude greater than that due to the "giant magnetoresistive effect" in a similar sized sensor structure.

The current-voltage characteristics of such "sandwich" structure sensors will exhibit a relatively linear change in the quantum electrodynamic effect "tunneling" current therethrough from one ferromagnetic layer through the barrier to the other with respect to the voltage provided across the sensor, i.e. across the barrier layer between these ferromagnetic layers, for relatively lower value voltages, but the current magnitude increases more than linearly for higher values of voltage across the sensor. As the voltage across the sensor increases, the fractional change in the "tunneling" current through the sensor, for the ferromagnetic layers having magnetizations changing from parallel to one another to antiparallel, decreases to being only half as great with several hundred millivolts across the sensor as occurs in the situation with a hundred or less millivolts across the sensor so that this fractional change with sensor voltage will range from a few percent to 20% or more. The fractional change in the resistance of the sensor for the ferromagnetic layers having magnetizations changing from parallel to one another to antiparallel increases to about one and one-half the room temperature values when the sensor is cooled to 77° K., but the "tunneling" current through the sensor increases by only about 10% to 20% indicating that the effective resistivity of the sensor is relatively insensitive to temperature (around 500 to 1000 ppm/°C.).

The effective resistivity of such a sensor is set by the amount of "tunneling" current through the cell permitted by barrier layer 14 for the voltage across the sensor. The high sensitivity of the "tunneling" current to the thickness of the barrier layer leads to a wide range of sensor resistivities which have been observed to be from 0.01 to 1000 MΩ-$\mu$m². On the other hand, the barrier layer appears to permit relatively little magnetic coupling between the ferromagnetic layers thereacross with the coupling fields typically being only a few Oe.

The barrier material for such sensing devices has typically been aluminum oxide, $Al_2O_3$ and other such oxides, but other dielectric materials have been used. A typical construction therefor has had two long rectangular ferromagnetic thin-film strips with the barrier layer therebetween such that the long axis of the bottom strip, supported directly on an electrically insulating substrate, at some angle with respect to that of the upper strip supported thereon through the barrier layer. This arrangement leaves the crossover area where these ferromagnetic strips overlap having the shape of a parallelogram defining the portion of the barrier layer through which there is effective current tunneling between the strips.

These devices were fabricated by depositing upon the insulating substrate a narrow stripe of the bottom ferromagnetic film typically using a separate, removable mask. A layer of dielectric material is then formed over this bottom film, and then a second narrow stripe ferromagnetic film is deposited through a mask such that the long direction axis of the second stripe is, typically, perpendicular to that of the first. The region of tunneling between the two stripes is then typically shaped as square or rectangle where the two stripes overlap. The shape of the interposed dielectric barrier is inconsequential so long as it is sufficiently large to completely separate the two ferromagnetic thin-film metal stripes. The ferromagnetic layers in these structures are typically simple single films of Fe, Co, NiFe or other common ferromagnetic alloys.

Generally, fabricating a very small overlap area in such sensors using masking techniques is difficult to accomplish because of deposition material spatial distribution variances which can lead to electrical short circuits between the strips. As a result, overlap area, or tunnel junction, dimensions are often of many millimeters in length and relatively thick barrier layers are needed.

The operating current for such sensors is typically supplied through a pair of current leads with one such lead connected to an end of the upper strip and the other lead connected to an end of the lower strip. The effective electrical resistance of the sensor is determined from measuring the voltage across the tunnel junction at two voltage leads each connected to one of the remaining two ends of these strips. Then, by providing a current of a known fixed value through the current leads and measuring the corresponding tunnel junction voltage on the voltage leads, the effective resistance can be simply calculated by dividing the measured voltage value by the chosen fixed current value.

Because, as indicated above, the conduction of current across the barrier of such a sensor is due to a quantum electrodynamic tunneling effect, the conduction turns out to be highly dependent on the thickness of the barrier. An increase of 2 Å in the barrier thickness can lead to an increase the junction resistance by a factor of 10. The measured resistances of tunnel junctions fabricated from the same starting material are inversely proportional to the areas of those junctions. Typical tunneling resistivities ($\rho_T$, calculated by multiplying the resistance by the tunnel junction area) range from $10^{-2}$ to $10^3$ M$\Omega$-$\mu m^2$. These resistivities correspond to $Al_2O_3$ thickness of about 12 to 30 Å, respectively. Due to the sharp dependence of tunnel resistivity on the barrier thickness, $\rho_T$ can easily vary across a single wafer by a factor of two.

As indicated above, the measured resistance of the tunnel junction in such a sensor is a function of the relative orientation of the magnetizations of the two ferromagnetic thin-film metal strips. The portion of the tunnel junction resistance that is subject to change as a result of that junction experiencing changes in external magnetic fields to which it is exposed is termed junction magnetoresistance (often written JMR, and defined as $\Delta R/R_{min}$ but is equivalently $\Delta V/V_{min}$ for voltage measurements with a fixed current with either being expressed as a percentage). The sensors described above demonstrated that the JMR therefor can be quite large at room temperature ($\approx 25\%$).

However, such sensors cannot be conveniently incorporated into integrated circuits because the sputter-mask mode of fabrication is not compatible with modern semiconductor fabrication. In addition, the magnetic response of these sensors are not optimized for applications. In particular, they exhibit considerable hysteresis, nonlinearity and other non-ideal aspects in their JMR response, including small signal output and low areal density, as have the tunnel junction field sensor structures of subsequent designs. Thus, there is a desire for tunnel junction sensors capable of sensing very small changes in external magnetic fields that reduce or eliminate these shortcomings and are compatible with modern semiconductor fabrication techniques.

BRIEF SUMMARY OF THE INVENTION

The present invention provides a magnetic field sensor having a junction structure in a sensor cell based on a dielectric intermediate separating material with two major surfaces on one of which is a base anisotropic ferromagnetic thin-film which is also on a base electrode, and on the other of which there is at least one of a plurality of separate anisotropic ferromagnetic thin-film but of differing effective coercivities. Similar structures have a separate film in each that can be interconnected to one another with the interconnections extending at least in part substantially parallel to the widths of the separated films. The base electrode and the separated films can have lengths with gradually narrowing widths toward each end which narrow to zero at the ends. The intermediate material supported on a base electrode can be common to all the separated films thereon. One or more planar coils can be supported at least in part on the separated films.

BRIEF DESCRIPTION OF THE DRAWINGS

FIG. 6 represents a portion of a layer diagram from of a structure similar to that of FIG. 1B; and FIG. 7 represents a circuit schematic diagram for a portion of the monolithic integrated circuit of FIG. 1A.

DETAILED DESCRIPTION

Figure 1A:
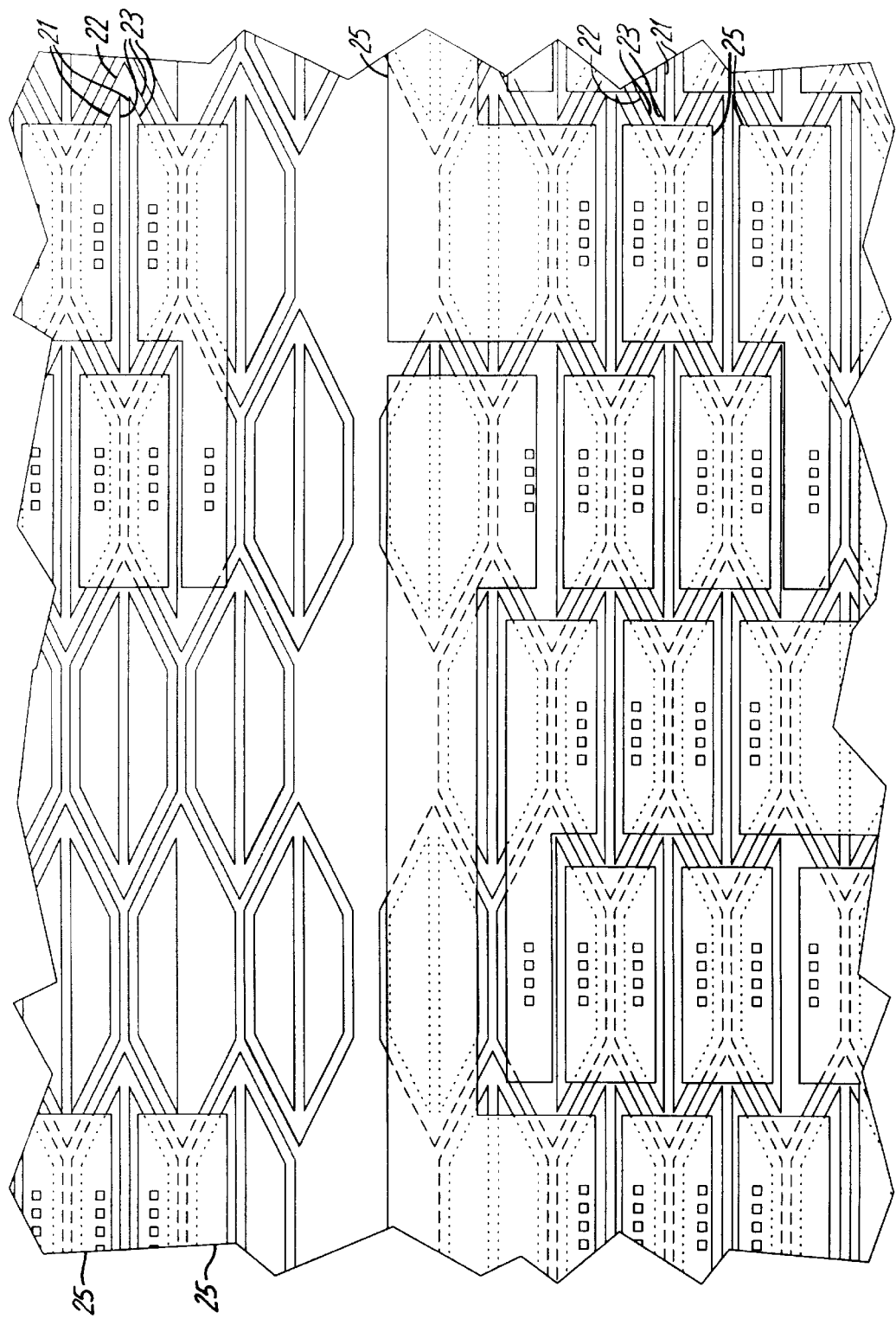
FIG. 1A represents a plan view of a portion of a monolithic integrated circuit structure embodying the present invention.

FIG. 1A shows a plan view of a portion of an embodiment of the present invention which includes some sensor cells for sensing very small magnetic field values as part of a sensor formed as a portion of a monolithic integrated circuit, including a supporting semiconductor chip as part of the sensor substrate which can have conveniently provided therein the operating circuitry for this sensor. Alternatively, the sensor can be provided on an electrically insulating substrate which does not have a monolithic integrated circuit therein, and instead has the operating circuitry for the sensor provided externally to the sensor structure. FIG. 1A shows portions of three different series connected sensor cell assemblages in two groupings. Sensor cells at the edges of these two groupings are left unconnected and so provide only similar magnetic conditions for sensor cells in the interior of these groupings. Also, a further number of sensor cells in one of the assemblages are unconnected in one of these groupings as there is a single assemblage of sensor cells in that grouping while the other grouping has two interleaved assemblages of sensor cells.

Figure 1B:
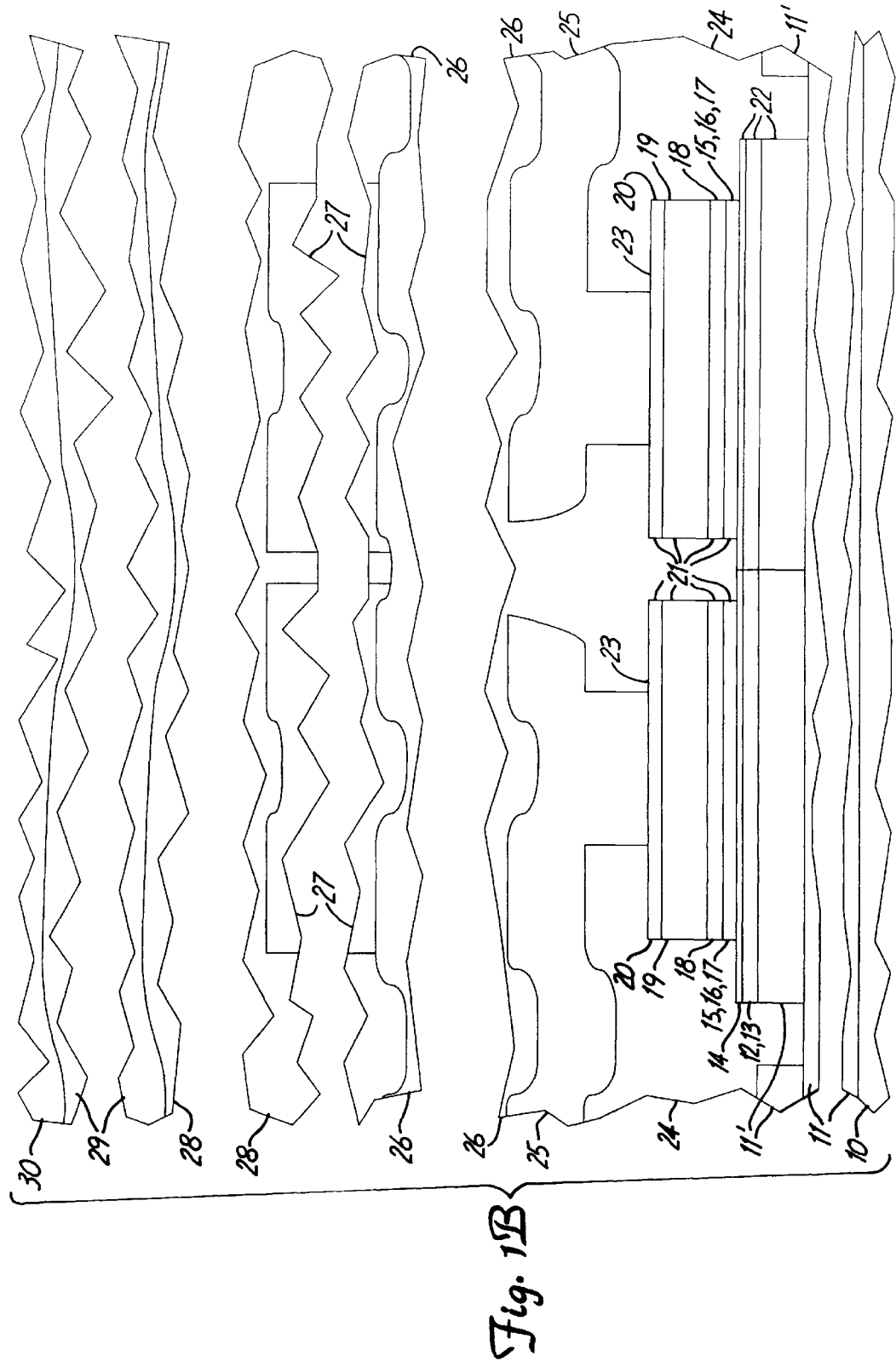
FIGS. 1B and 1C are layer diagrams of a portion of this structure.
Figure 1C:
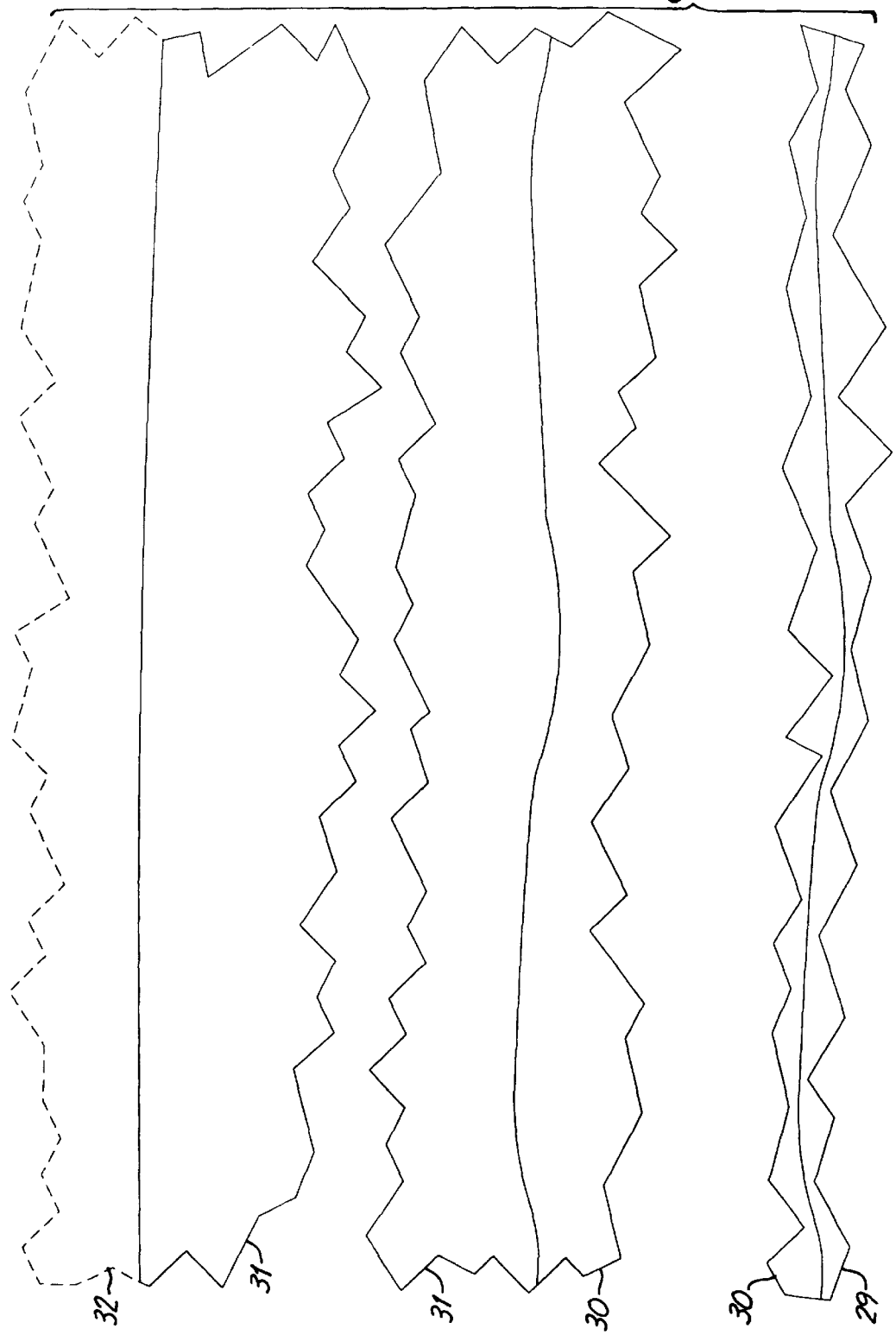

FIGS. 1B and 1C provide layer diagrams with fragmentary views of a portion of the view shown in FIG. 1A to show the layered structure of a sensing cell therein, and also has parts thereof broken out to show some of the structure therebelow, again for greater clarity. The biasing, shielding, concentrating and protective layers provided over portions of the structure shown in FIG. 1A in actual use have been omitted in this view for clarity, but these layers are shown in part in FIGS. 1B and 1C. Certain other portions of some layers have been omitted, again for clarity, so that the structure portions present are shown in solid line form if they are exposed in the absence of some layer thereover now omitted, but with other structure portions beneath the solid line form portions appearing in these figures being shown in dashed line form.

Figure 2:
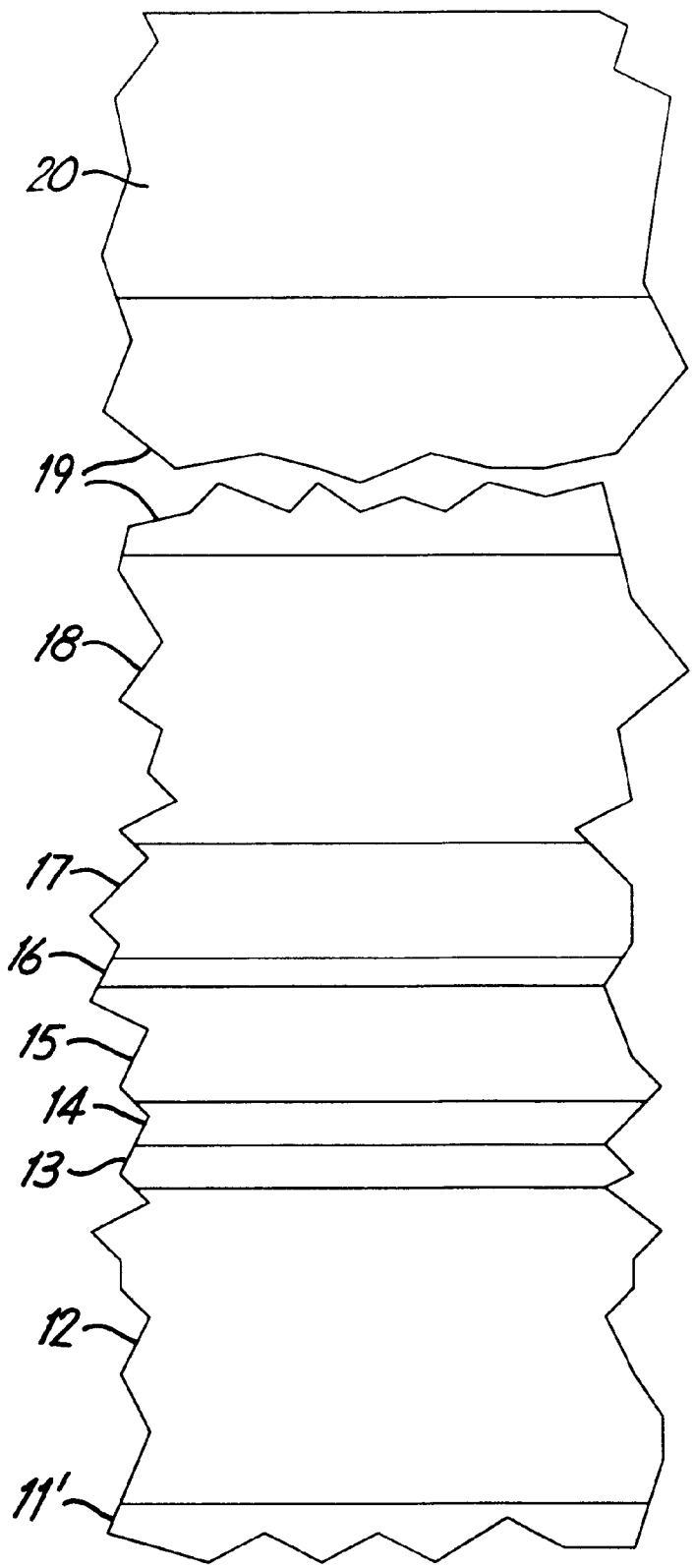
FIG. 2 represents a fragmentary portion of the layer diagram of FIG. 1B.

Corresponding to FIGS. 1A and 1B is FIG. 2 which is a layer diagram of a corresponding portion of the structures shown in FIGS. 1A and 1B forming a sensor cell. This higher resolution layer diagram gives an indication of the structural layers leading to portions of the structures shown in FIGS. 1A and 1B, but FIGS. 1B and 2 are not true cross section views in that many dimensions therein are exaggerated or reduced for purposes of clarity.

As indicated above, the sensor cell structures in these figures are typically provided on a semiconductor chip, 10, having suitable operating circuitry for the sensor arrangement provided in the resulting monolithic integrated circuit structure. An electrical insulating layer, 11, formed on semiconductor chip 10 by a sputter deposition of silicon nitride, supports the sensor cell "sandwich" structures thereon each of which comprises a ferromagnetic thin-film layer and a ferromagnetic compound layer that are separated from one another by a nonmagnetic, electrically nonconductive or dielectric intermediate layer, or barrier layer, as will be described in more detail below. Typically, layer 11 is formed by this silicon nitride deposited to a thickness of about 2,000 Å to provide not only electrical insulation but to also provide a very smooth support surface on which to form the structures to be supported including these "sandwich" structures. The resulting surface of layer 11 typically exhibits a surface roughness of less than 2 Å on a root-mean-square basis. Photoresist is spread over layer 11 and patterned to provide via openings therethrough and through appropriate ones of the insulating layers in integrated circuit 10.

A conductivity enhancement layer for the above indicated sensor cell "sandwich" structures is next provided on insulating layer 11 as the basis for both such a conductivity enhancer and as a further substrate portion for supporting the sensor cell "sandwich" structures to be subsequently provided. Thus, a metal deposition is made by sputtering on layer 11 aluminum to cover that layer. This metal layer is typically deposited to a thickness of 85 Å, but can be made much thicker if desired to give a significantly greater conductivity enhancement although with the detriment of having an exposed resulting upper surface on which further structures are to be supported that exhibits increasing roughness with increasing layer thickness. Thicknesses beyond some point will require sputter deposition with a direct current bias on the electrodes in the sputtering chamber in addition to the usual radio frequency field bias used, and perhaps other special conditions, to obtain a sufficiently smooth upper surface. Alternatively, an ion beam sputtering process may have to be used to obtain sufficient smoothness. A cell conductivity enhancement base layer, 11', which will result from this after structure forming steps are subsequently undertaken, is shown in FIG. 1B resulting from such steps, but it is not yet separately formed at this point in the fabrication process from the deposited layer just described. A portion of resulting layer 11' is shown in the high resolution drawing of FIG. 2.

Thereafter, the sensor cell "sandwich" structures just mentioned are provided on insulating layer 11 and the conductivity enhancement layer with the composite ferromagnetic thin-film layer and the intermediate layer along with magnetization direction determination layers being provided, or at least initially provided, through sputter deposition as a basis for forming a magnetoresistive sensor cell. This multilayer structure will have a vertical direction effective resistivity based on the quantum electrodynamic effect tunneling current passing therethrough which might range from 0.01 to 10,000 M$\Omega$-$\mu$m$^2$ because of the extreme sensitivity of this effective resistivity to the thickness of the barrier layer. In addition, the structure will typically exhibit an effective capacitance and a magnetically controlled tunneling effect response exceeding 20% between the minimum effective resistance value and the maximum effective resistance value achievable under such control.

In this structure, the second layer that is provided on the first layer previously provided for the sensor cell structure, the conductivity enhancement layer, is a composite ferromagnetic thin-film layer sputter deposited onto conductivity enhancement layer 11' with the result shown in FIGS. 1B and 2 after the subsequent structure forming steps indicated above. A first stratum, 12, of this composite ferromagnetic thin-film layer is formed of a NiFeCo alloy of 65% nickel, 15% iron and 20% cobalt deposited to a thickness of 110 Å, which has a magnetic saturation induction of typically about 10,000 Gauss, and this process results in the deposited film having a face-centered cubic structure. The deposition of this layer occurs in the presence of an external magnetic field in the plane of the film, typically oriented perpendicular to a direction parallel to the extended direction of conductivity enhancement layer 11' in FIG. 1B to ease the providing of a magnetic bias in this direction, though this is not a necessary orientation. A direction parallel to the extended direction of conductivity enhancement layer 11' in FIG. 1B is a direction extending in or out of the plane of that figure. This fabrication magnetic field will leave the easy axis of the stratum film similarly directed. Alternatively, the deposition field may be provided at another angle to the extended direction of conductivity enhancement layer 11' to provide some bias rotation of the layer magnetization, but typically the alternative orientation selection is a zero angle, i.e. parallel to the extended direction, to provide for maximum sensitivity of the tunnel junction structure being fabricated to external magnetic fields.

A second stratum, 13, is also provided in a sputter deposition step in the presence of a similarly directed easy axis orienting magnetic field. Second stratum 13 is a CoFe alloy formed of 5% iron and 95% cobalt to a thickness of 15 Å resulting in this material having a magnetic saturation induction of approximately 16,000 Gauss which is a higher value than that of the magnetic saturation induction of first stratum 12. This higher saturation material is provided adjacent the intermediate or barrier layer, which is the next layer to be formed, to thereby obtain a greater magnetically controlled tunneling effect, but the lower saturation value in stratum 12 is provided to keep the composite film more sensitive to smaller fields than it would be in its absence leaving the entire layer formed as stratum 13. These strata are separately shown in FIG. 2 with the composite layer being designated 12, 13 as shown in FIG. 1B as it will result from the subsequent structure forming steps, this composite layer and cell conductivity enhancement base layer 11' together forming a base electrode for the sensor cell shown in FIG. 1B. Again, as with conductivity enhancement layer 11', sputter deposition with special conditions may have to be used in providing composite layer 12, 13 to obtain a sufficiently smooth resulting exposed upper surface on stratum 13 to support the next layer thereon.

Thereafter, an intermediate or barrier layer, 14, is provided by sputter deposition and oxidation onto layer 13, this intermediate layer being a dielectric. Layer 14 is begun typically by sputter depositing 12 Å of aluminum onto layer 13, and continuing to provide two further angstroms of this material using the aluminum sputtering target but also introducing oxygen into the sputtering chamber. The result is to convert the already deposited aluminum layer substantially into aluminum oxide which expands its thickness by a factor of about 1.3, and to add another two angstroms of aluminum oxide thereto giving an intermediate layer or barrier layer thickness of approximately 17.5 Å with the layer being formed primarily of aluminum oxide $Al_2O_3$. Any portion of the previously deposited aluminum metal unoxidized in this process will result in a very thin layer of that aluminum on and between composite ferromagnetic layer 12,13 and the aluminum oxide dielectric barrier layer which can be advantageous. The result after the subsequent structure forming steps is shown in both FIGS. 1B and 2.

A high quality barrier layer result is the main reason that very smooth upper surfaces are required for insulating layer 11, conductivity enhancement layer 11', and ferromagnetic strata 12 and 13 with the smoothness of the upper surfaces of the lower layers in this sequence of layers affecting the smoothness of the upper surface of the succeeding layer formed thereon. As is well known for the quantum electrodynamic tunneling effect as indicated above, the properties of this effect are highly dependent on the barrier layer thickness. Barrier layer 14 will typically be in the range of 10 to 20 Å thick in most tunnel junction structures, and so a small variance therein such as a 3 Å deep concavity will result in a greatly concentrated current density at that location because of the resulting relative thinness of the barrier layer there. Thus, there is a significantly increased risk of catastrophic breakdown of the barrier layer at such a location therein should any high voltages come to occur across the tunnel junction during use because of voltage transients or the like. An additional reason to avoid roughness in the surface supporting barrier layer 14, and in the upper surface of that layer, is that unwanted interlayer magnetic coupling between the ferromagnetic layers on either side thereof due to the "orange peel" effect, or "Nèel coupling", is directly related to the interfacial surface roughness. Thus, the upper surface of stratum 13 and of the upper surface of barrier layer 14 typically should have a surface roughness on the order of 2 Å or less on a root-mean-square basis.

The provision of layer 14 is followed by providing a compound ferromagnetic thin-film layer that is provided on layer 14. This compound ferromagnetic thin-film layer is provided to have a net layer magnetization that, when fixed in orientation in the finally formed structure, will resist rotation, and certainly resist firmly any rotation that could be sufficient to lead to a reversal in its orientation as a result of externally applied magnetic fields of up to 1000 Oe or somewhat more. Thus, for the finally formed sensing structure which is intended to be used in, and sense, very small magnetic fields, the magnetization of this compound ferromagnetic thin-film layer will appear fixed in its orientation in the device, i.e. "pinned" in a direction relative to the finally formed structure which will be aligned with the direction the sensor cell is intended to sense external magnetic fields during use in the resulting sensor.

This compound ferromagnetic thin-film layer is formed by sputter deposition beginning with depositing a ferromagnetic layer, 15, of CoFe comprising 95% cobalt and 5% iron to a thickness of 40 Å which is deposited in the presence of an easy axis direction determination magnetic field which is aligned with the easy axis direction of first composite ferromagnetic layer 12,13 in an eased biasing sensor design. Then a nonmagnetic layer, 16, of ruthenium (copper could alternatively be used) is sputter deposited (no orienting magnetic field needed in this instance) to provide a Ru antiferromagnetic coupling layer of 9 Å thickness. Thereafter, another ferromagnetic layer, 17, of CoFe comprising 95% cobalt and 5% iron is deposited to a thickness of 40 Å again in the presence of an easy axis direction determination magnetic field aligned as was the field for layer 15. These layers are each shown in FIG. 2 but shown as a compound ferromagnetic layer 15,16,17 in FIG. 1B as it will result after the subsequent structure forming steps.

Compound ferromagnetic layer 15,16,17 has materials with high spin polarization in its outer layers due to the use of high magnetic induction CoFe therein, but has little net magnetic moment because of the Ru layer provided therebetween which strongly antiferromagnetically couples these outer layers through primarily exchange coupling (some magnetostatic coupling also present) so that the magnetizations of each are pointed in opposite directions. Thus, this layer is relatively insensitive to externally applied fields and contributes little to the spatial fields thereabout. However, the magnetization direction in this composite layer by itself is not very strongly fixed in any direction because of the relatively weak anisotropy exhibited by the CoFe layers.

Thus, a further anti ferromagnetic material "pinning" layer exhibiting a substantial magnetic anisotropy must be deposited on layer 17 to strongly set the magnetization direction of composite layer 15,16,17 in the direction in which the resulting sensor cell is intended to sense external magnetic fields during use as a sensor. Such a layer has a strongly fixed magnetization direction which, through exchange coupling to layer 17, strongly fixes the direction of magnetization of that layer also, and so that of layer 15 through Ru layer 16. The result is an antiferromagnetic layer coupled strongly to compound layer 15,16,17 which also provides a high magnetic inductance material layer, layer 15, with a corresponding substantial spin polarization against barrier layer 14. Hence, a IrMn pinning layer, 18, of 20% iridium and 80% manganese is sputter deposited on layer 17 to a thickness of 100 Å in the presence of a magnetization axis determination magnetic field aligned with the fields used in forming CoFe layers 15 and 17. Alternatively, pinning layer 18 can be formed using FeMn, NiMn, PtMn, PtRhMn or PtRuMn or some other antiferromagnetic materials. Pinning layer 18 is shown in FIGS. 1B and 2 as it will result after the subsequent structure forming steps.

After completing this antiferromagnetic magnetization pinning arrangement using these magnetization direction determination layers, a 360 Å layer of aluminum is sputter deposited on pinning layer 18 to passivate and to protect the sensor cell therebelow, and to allow electrical connections thereto for circuit purposes. The resulting layer, 19, is shown in broken form in FIG. 2 because of its significantly greater thickness compared to the ferromagnetic composite layers and the nonmagnetic intermediate or barrier layer. Again, this layer is shown in FIGS. 1B and 2 as it will result after the subsequent structure forming steps.

Because surface cleanliness of a layer resulting from a completed deposition prior to forming the next layer in sequence thereon has a significant effect on surface roughness of this subsequent layer after its deposition, the deposition of layers 11 to this point, i.e. through layer 19, are typically done in a sputter deposition chamber one after the other over which steps a vacuum is maintained without an intervening exposure to the atmosphere occurring which could allow surface contamination or oxidation to occur. This procedure also allows for more precise control over the layer thicknesses since no surface cleaning steps are needed prior to depositing the next layer which would introduce thickness variations with a small but more or less random portion. If desired, wafers which are completed to this point in the sensor fabrication process can be removed form the sputtering deposition chamber and, for example, stored to complete the remaining steps in the fabrication process at a later time.

Next in this fabrication process, a further layer, 20, is deposited on layer 19 as shown in FIG. 2 to a thickness of 100 Å to provide an etching termination layer, or stop, for subsequent etching steps. Layer 19 is first sputter cleaned which removes around 50 Å thereof. Then, layer 20 is sputter deposited on cleaned layer 19 as a chrome silicon layer with 40% chrome and 60% silicon to serve as an etch stop for the subsequent etching of a layer to be provided thereover as a milling mask. Once more, this layer is shown in FIGS. 1B and 2 as it will result after the subsequent structure forming steps.

This milling mask layer of silicon nitride is next sputter deposited on layer 20 to a depth of 750 Å to there be prepared for use as a milling mask, but this layer is not shown in FIG. 2 because its remnants will be incorporated in a further insulating layer to be provided later. On this silicon nitride mask layer, photoresist is deposited and patterned in such a way as to form a pattern for an etching mask which is to be formed following that pattern by leaving the masking portions of the silicon nitride layer therebelow after etching through the photoresist pattern. This last masking pattern in the silicon nitride is to result, after milling therethrough to remove the exposed ferromagnetic, antiferromagnetic and nonmagnetic layers therebelow, in a substantial number of separated pinned electrode structures to serve as portions of the corresponding sensor cells in the sensor with each such pinned electrode being in a "sandwich" construction with barrier layer 14 and the base electrode. Reactive ion etching is used with the patterned photoresist to remove the exposed portions of the silicon nitride masking layer down to chrome silicon layer 20 serving as an etch stop. The remaining portions of the silicon nitride layer protected by the photoresist serve as the above mentioned milling mask for the subsequent ion milling step which removes the exposed portions of chrome silicon layer 20, and thereafter, also the then exposed portions of aluminum layer 19, the next exposed portions of pinning layer 18, and then the next exposed portions of the compound ferromagnetic thin-film layer formed as strata 15, 16 and 17 down to barrier layer 14 to thereby form the structure of the pinned electrodes. The last of this material removal by etching may be accomplished by use of a chemical wet etch rather than by ion milling to assure a more precise stop of the etching at barrier layer 14 which serves as an etch stop for this etch.

A portion of one of the resulting pinned or top electrodes, 21, from FIG. 1A is shown in FIG. 2, as indicated above, and has counterparts thereof shown in FIG. 1B (where they are designated again by numeral 21) with only some of the layers in each such cell being represented as distinct in this latter figure. The full multilayer structure that is shown in FIG. 2 with the distinct strata in the compound ferromagnetic layer is not shown in that manner in FIG. 1B because of the larger scale used in that figure. Some further ones of these pinned electrodes can also be seen in the plan view of FIG. 1A, and each of such structures is also designated by numeral 21 in that figure. The easy axes of the antiferromagnetic layer, and so of the ferromagnetic thin-films in the compound layers in each of pinned electrodes 21 are perpendicular to the direction of the longest extent of those structures. Each pinned electrode 21 is formed with a rectangular central portion in this plan view continuing into right-angle triangular portions tapering away from opposite ends of the rectangular portion along the easy axis to form the ends of the electrodes, i.e. a trapezoidal shaped structure, with the two pinned electrodes in each cell having their long sides facing and parallel to one another. Alternatively, such a trapezoidal structure shape can be replaced by a smooth curve outline shaped structure such as a half oval or half ellipse.

A second etch is then performed to form the barrier and base electrode for each cell. The remnants of the silicon nitride mask on the remaining portions of chrome silicon layer 20 and the now exposed portions of barrier layer 14 have a further silicon nitride layer sputter deposited thereon to a thickness of 300 Å which again is not shown in FIG. 2 because its remnants will be incorporated in a further insulating layer to be provided in a subsequent step. On this latter silicon nitride mask layer, photoresist is deposited and patterned in such a way as to form a pattern for an etching mask which is to be formed following that pattern by leaving the masking portions of the silicon nitride layer therebelow after etching through the photoresist pattern.

This last masking pattern in the silicon nitride is to result, after milling therethrough to remove the exposed barrier layer, ferromagnetic layers and conductivity enhancement layer, in a substantial number of separated base electrode structures to serve as portions of the corresponding sensor cells in the sensor with each such base electrode being in a "sandwich" construction with barrier layer 14 and the corresponding two pinned electrodes (or one pinned electrode in some instances). Reactive ion etching is used with the patterned photoresist to remove the exposed portions of the silicon nitride masking layer down to barrier layer 14 serving as an etch stop. The remaining portions of the silicon nitride layer protected by the photoresist serve as the above mentioned milling mask for the subsequent ion milling step which removes the exposed portions of barrier layer 14, and thereafter, also the next exposed portions of the composite ferromagnetic thin-film layer formed as strata 12 and 13, and the then exposed portion of conductivity enhancement layer 11' down to insulating layer 11 to thereby form the structure of the base electrodes and complete the structure of the sensor cell.

A portion of one of the resulting base or bottom electrodes, 22, from FIG. 1A is also shown in FIG. 2, as indicated above, and has a counterpart thereof shown in FIG. 1B (where it is designated again by numeral 22) with only some of the layers in each such cell being represented as distinct in this latter figure. The full multilayer structure that is shown in FIG. 2 with the distinct strata in the composite ferromagnetic layer is too not shown in that manner in FIG. 1B because of the larger scale used in that figure. Some of these base electrodes forming the bases of sensor cells can also be seen in the plan view of FIG. 1A, and each of such structures is also designated by numeral 22 in that figure. A tunnel junction structure, 23, comprises a base electrode 22 supporting a corresponding pinned electrode 21 separated therefrom by a corresponding barrier layer 14, with a base electrode 22 supporting two corresponding pinned electrodes 21 separated therefrom by a corresponding barrier layer 14 forming a sensor cell.

The easy axes of the ferromagnetic thin-films in the composite layers in each of base or bottom electrodes 22 are typically either parallel to, or perpendicular to, the direction of the longest extent of those structures as described above. Each base electrode 22 is formed with a rectangular central portion in this plan view continuing into isosceles triangular portions tapering away from opposite ends of the rectangular portion in directions perpendicular to the easy axis of the pinned electrodes to form the ends of the base electrodes, and which extend beyond and support the corresponding two pinned electrodes provided for that cell (again, these pinned electrodes having their long sides facing and parallel to one another). Alternatively, the base electrode structure shape can be replaced by a smooth curve outline shaped structure, such as an oval or ellipse, or better, by the overlap portion of two circles having centers offset from one another by less than the diameter of either.

Following the completion of tunnel junction structures 23, another layer of silicon nitride is sputter deposited over those structures and the exposed portions of insulating layer 11 and barrier layer 14 to a thickness of 1000 Å to form another insulating layer. Photoresist is provided over this insulating layer as an etching mask to provide via openings therethrough in a following etching step to form a completed insulating layer, 24, and then through silicon nitride layer 11 and appropriates ones of other insulating layers in integrated circuit 10.

On insulating layer 24, so prepared, a further metal deposition is made again of aluminum, but here alloyed with 2% copper, to cover that layer and fill the via openings therein, and in silicon nitride layer 11 and the insulating layers in integrated circuit 10. This metal layer is deposited to a thickness of 2000 Å typically. Photoresist is spread thereover with openings therein where the unwanted portions of that metal layer are to be eliminated, and reactive ion etching is undertaken to provide this elimination of the unwanted metal layer portions. The structures that result from this elimination is shown in FIG. 1B, and in FIG. 1A, as a plurality of interconnections, 25, for interconnecting tunnel junction structures 23 of the sensor cells in series with one another and providing extensions for interconnections external to the sensor cells. As a result of the via openings in silicon nitride layer 11, sensor cell interconnections 25 are also interconnected with electronic circuitry in the integrated circuits in semiconductor substrate 10 therebelow.

The completion of interconnection structures 25 is followed by depositing another layer of typically 3000 Å of silicon nitride thereover, and over the exposed portions of silicon nitride layer 24 to form a further insulating layer. Photoresist is provided over this last insulating layer as an etching mask to provide via openings therethrough in a further etching step to form a completed insulating layer, 26, and through silicon nitride insulating layers 24 and 11 as well as though appropriate ones of the insulating layers in integrated circuit 10. Insulating layer 26 is shown broken in FIG. 1B because of its larger thickness relative to the other structures shown therein.

On insulating layer 26, prepared in this manner, a further metal deposition is made, again of aluminum alloyed with 2% copper, to cover that layer and fill the openings therein, and in silicon nitride layers 19 and 11 as well as the insulating layers in integrated circuit 10. This metal layer is typically deposited to a thickness of 1.5 $\mu$m. Photoresist is spread thereover with openings therein where the unwanted portions of that metal layer are to be eliminated, and reactive ion etching is undertaken to provide this elimination of the unwanted metal layer portions. The structures that result from this elimination are shown in FIG. 1B, and in FIG. 1A, as a plurality of first biasing coil lines, 27, plus bonding extensions for the sensor each positioned across insulating layer 26, interconnection structures 25, and insulating layer 24 from corresponding tunnel junction structures 23 supported on insulating layer 11. As a result of the via openings, these biasing coil lines are also interconnected with electronic circuitry in the integrated circuits in semiconductor substrate 10 therebelow.

Figure 1D:
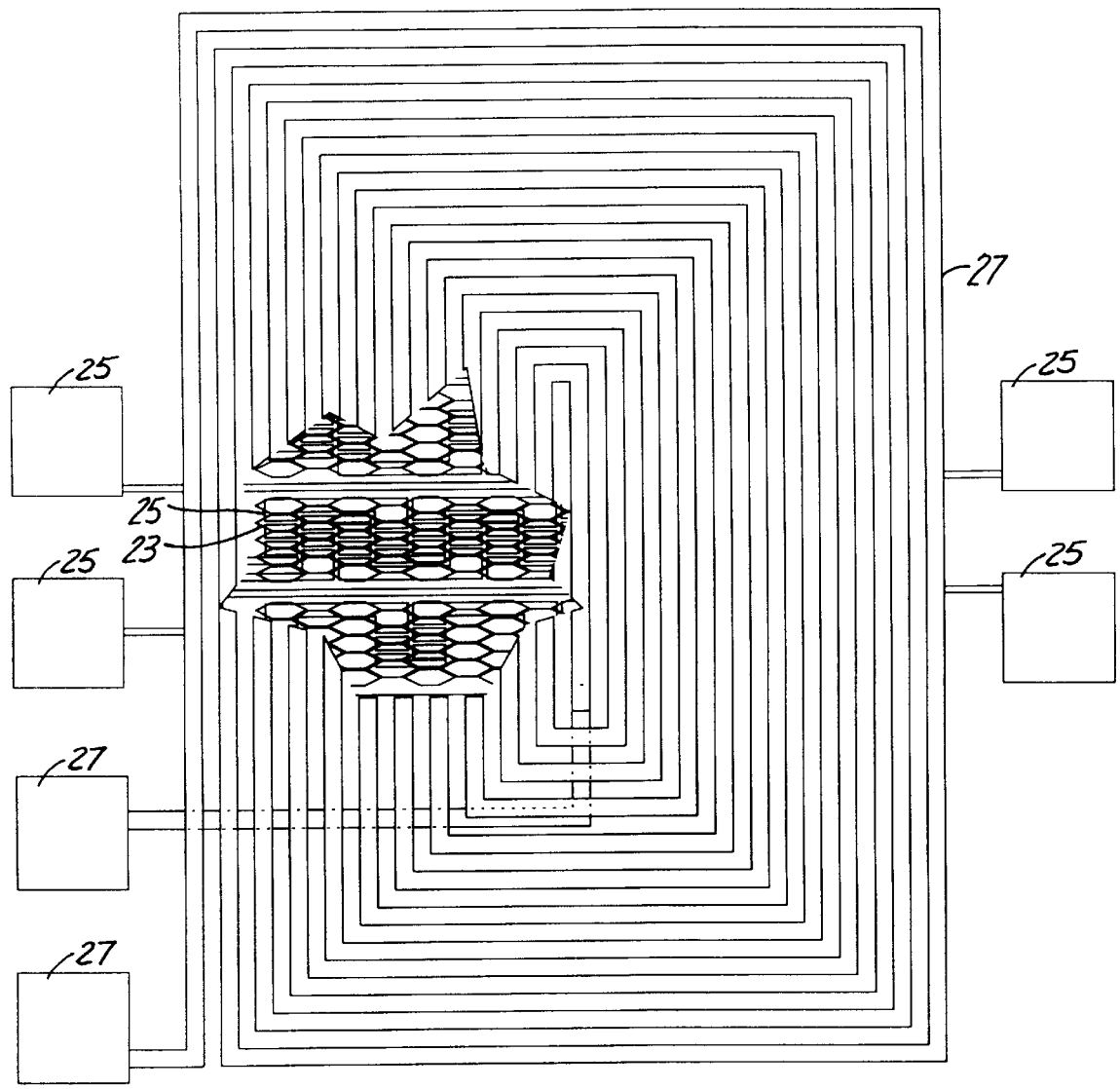
FIGS. 1D and 1E are other plan views of portions of this structure.

Current supplied in first biasing coil lines 27 provides orthogonal magnetic biasing of composite ferromagnetic layer 12,13 as described below by providing a magnetic field primarily oriented perpendicular to the direction of the fixed magnetization axis of antiferromagnetic layer 18, i.e. perpendicular to the axis along which external magnetic fields are intended to be sensed which is parallel to the widths of tunnel junction structures 23. First biasing coil lines 27 are shown broken in FIG. 1B again because of their larger thickness relative to the other structures shown therein. A plan view of the sensor as completed to this point in the fabrication process is shown in FIG. 1D. The further coil, shielding, concentrating and protective layers provided over portions of the structure shown in FIG. 1D in actual use have been omitted in this view for clarity.

The completion of first biasing coil lines 27 is followed by depositing another layer of silicon nitride thereover to a thickness of 1.5 $\mu$m, and over the exposed portions of silicon nitride layer 26 to form a further insulating layer. Photoresist is provided over this last insulating layer as an etching mask to provide via openings therethrough in a further etching step to form a completed insulating layer, 28, and through silicon nitride insulating layers 26, 24 and 11 as well as though appropriate ones of the insulating layers in integrated circuit 10. Insulating layer 28 is also shown broken in FIG. 1B because of its larger thickness relative to some of the other structures shown therein.

On insulating layer 28, prepared in this manner, a further metal deposition is made, again of aluminum alloyed with 2% copper, to cover that layer and fill the openings therein, and in silicon nitride layers 26, 24 and 11 as well as the insulating layers in integrated circuit 10. This metal layer is typically deposited to a thickness of 1.5 $\mu$m. Photoresist is spread thereover with openings therein where the unwanted portions of that metal layer are to be eliminated, and reactive ion etching is undertaken to provide this elimination of the unwanted metal layer portions. The structures that result from this elimination are shown in FIG. 1B, and in FIG. 1A, as a plurality of second biasing coil lines, 29, plus bonding extensions for the sensor each positioned across insulating layers 28 and 26, interconnection structures 25, and insulating layer 24 from corresponding tunnel junction structures 23 supported on insulating layer 11. As a result of the via openings, these second biasing coil lines are also interconnected with electronic circuitry in the integrated circuits in semiconductor substrate 10 therebelow.

First biasing coil lines 27 and second biasing coil lines 29 are arranged geometrically to provide orthogonal magnetic fields when currents are supplied therethrough with second biasing coil lines 29 providing a magnetic field primarily oriented parallel to the direction of the fixed magnetization axis of antiferromagnetic layer 18, i.e. the axis along which external magnetic fields are intended to be sensed. Second biasing coil lines 29 can be used for either canceling out magnetostatic coupling between composite ferromagnetic layer 12,13 and compound ferromagnetic layer 15,16,17, or for providing internal feedback if the sensor is to be operated in a "closed loop" configuration. In such a closed loop configuration, a magnetic field is generated by current in second biasing coil lines 29 at tunnel junction structures 23 which precisely cancels the external magnetic field currently present at those structures. As a result, the tunnel junction resistance of these structures does not change, but instead the current fed back through second biasing coil lines 29 does change in a substantially linear response to provide the magnetic field just sufficient to cancel external magnetic present at these structures to thereby hold their junction resistances constant at their zero field value. Thus, the currents through second biasing coil lines 29 as feedback coils is a measure of the magnitudes of the external magnetic fields present at tunnel junction structures 23.

Operating in such a closed loop configuration provides a number of benefits. First, the linear range of such a sensor operated in a bridge circuit is far greater than a sensor where the bridge resistance is the measured quantity because the bridge resistance is kept substantially constant. Secondly, the behavior of the sensor is more consistent because there is little net change in the magnetic field present at tunnel junction structures 23. Third, the temperature coefficients of the sensing elements are less important as they are effectively replaced by the temperature coefficients of the feedback circuit.

Figure 1E:
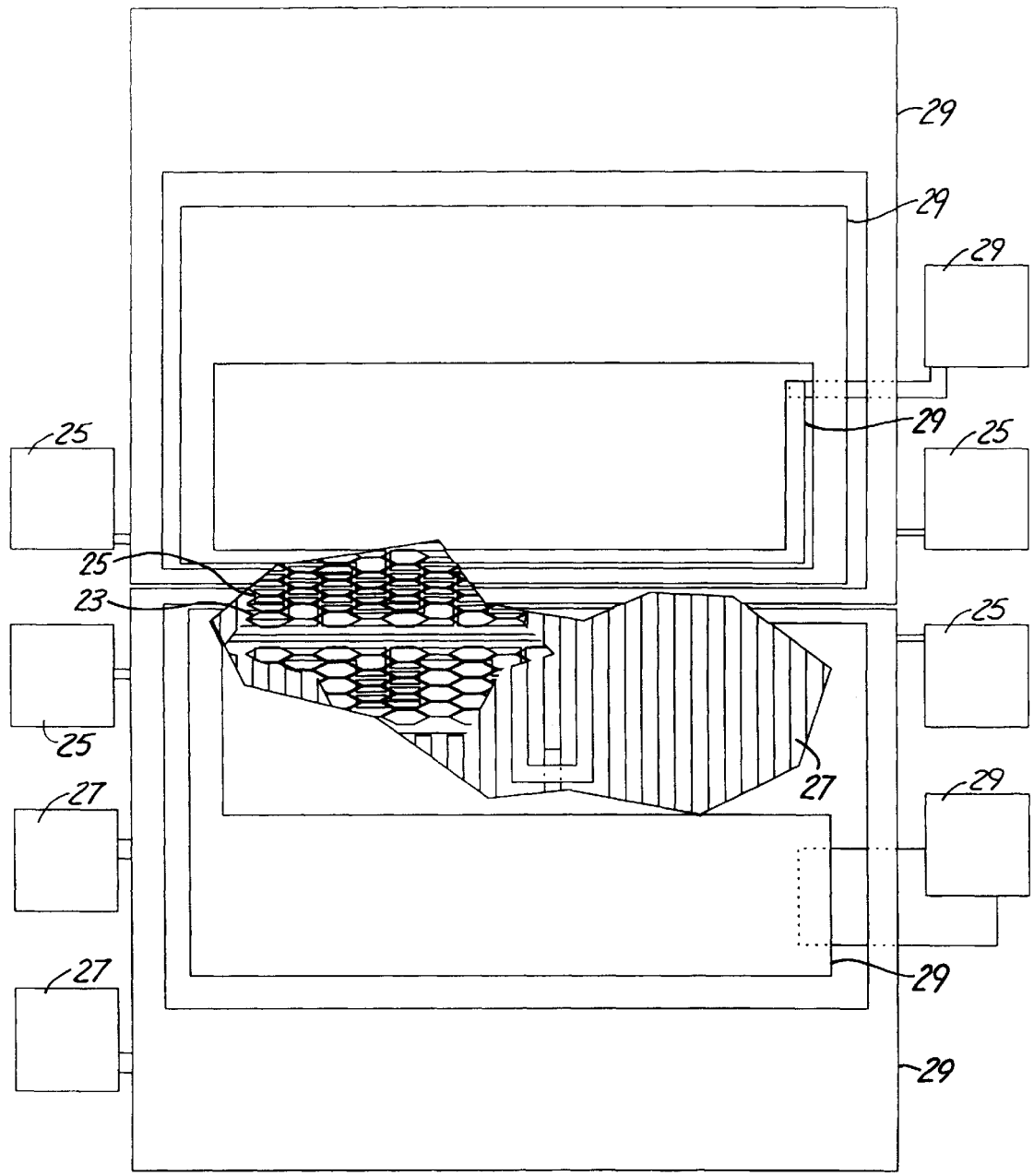

A further insulator layer, 30, is provided by sputter depositing 1.5 μm of silicon nitride over second biasing coil lines 29 and the exposed portions of insulating layer 28. Insulator 30 serves as a passivation and protection layer for the device structure therebelow, and has only that purpose in those locations where there is no magnetic flux concentrator-shield structure thereabove. Layer 30 is seen in part in FIG. 1B but is not shown in FIG. 1A to avoid obscuring that figure. A plan view of the sensor as completed to this point in the fabrication process is shown in FIG. 1E. The protective layer provided over portions of the structure shown in FIG. 1D in actual use have been omitted in this view for clarity.

In some locations, however, layer 30 also serves as a base for a concentrator-shield structure to be provided by a thick (0.5 mil) permalloy material plated thereon over those interconnected sensor cells forming a sensor selected to be shielded from external magnetic fields. Such plating begins with a 1000 Å plating seed film of permalloy which is sputtered onto this silicon nitride base. This initially plated result is then coated with a thick layer of photoresist which is exposed and developed to define the regions where the main portions of the concentrator-shield structure is to be plated. This is followed by chemically plating a 4 μm thick layer of gold on the exposed portions of the permalloy seed plating. The gold improves adhesion of the main portions to be provided. Such main portions are then chemically plated onto the exposed gold to a thickness of 12.5 μm to provide a concentrator-shield, 31, shown in FIG. 1C. The seed layer and the gold layer are not separately shown but are instead included as part of concentrator-shield 31. Both insulating layer 30 and concentrator-shield 31 are shown broken in FIG. 1C because of the greater relative thickness of each as compared to structures shown in FIG. 1B.

The developed photoresist is then removed, and the resulting construct is then dipped into a bath formed of a mixture of phosphoric, ascetic and nitric acids to remove the 1000 Å permalloy seed layer from all areas not under concentrator-shield 31. A final mask then defines bonding pads to be provided, and vias therefor to interconnection arrangement 25 are provided using this mask and a reactive ion etching step. This last etching step can be preceded by a further sputter deposition of silicon nitride for protective purposes, if desired, thereby providing the layer shown in dashed lines and designated 32 in FIG. 1C. The wafer after such provision of bonding pad vias is then ready for wafer probe, dicing, and packaging.

The magnetic field provided by current supplied in an appropriate direction through first biasing coil lines 27 forming a planar winding is, at locations beneath and very near this winding with respect to its planar extent, parallel to the plane of that winding and directed substantially toward the center of the winding in that plane everywhere along the winding. Thus, less than a quarter (one quarter segment) of the total area underneath that winding has the field therein due to current in the winding directed in any one direction as the direction of the center changes at different locations on the winding about that center. However, nearly half the area under the winding has fields directed toward the center along a single axis, i.e. those field arising from opposite sides of the winding in being directed toward the center point along the same axis but in opposite directions. Since tunnel junction structures resistance versus sensitive axis, or easy axis, directed, external magnetic fields characteristic is insensitive to the direction of the orthogonal magnetic bias (the magnetic bias can be oriented in either way along the direction parallel to the direction of longest extent of conductivity enhancement layer 11' direction), an opposite two of the four quarter segments under this winding are jointly suited for use orthogonal biasing. This insensitivity follows from $dR/d(\theta)$ having the opposite sign for a 180 degree bias, and $d(\theta)/dH_{ext}$ along the sensitive axis also having the opposite sign, in the junction characteristic where the junction sensitivity is $dR/dH_{ext}$.

The ability to position tunnel junction structures 23 under both of two opposite sides of first biasing coil lines 27 forming the planar winding having oppositely directed magnetic biasing, rather than having to position all of these structures under just one side of that winding saves approximately a factor of four in both substrate, or chip, support surface usage and in power consumption by that winding. This is true because additional coil lines to double the width of the surface covered by one side of that winding so as to be able to accommodate all of the structures under that one side requires a similar addition to the length of that winding to accommodate the additional coil lines, thus increasing the surface area covered by the winding by multiples of those length additions. Since the coil lines must fill this additional area, the total path length of the winding will increase in proportion to this area increase which significantly increases the winding resistance and power consumed for a given current density.

Since any external magnetic field present which is orthogonal to the sensing direction of the sensor also effectively adds to, or subtracts from, the orthogonal magnetic bias, any bridge circuit used for the sensor is arranged so that each resistive leg therein has half its sensor cells under one quarter segment of the planar winding formed by first biasing coil lines 27, and half under the other opposite quarter segment. Thus, the resistive legs of such a bridge circuit each have the same behavior under slightly non-ideal biasing conditions. Each resistive leg is then an assemblage of interconnected tunnel junction structures with half of them having increasing sensitivity ($dR/dH_{ext}$) perpendicular to the sensitive axis and half of them having decreasing (opposite algebraic sign) sensitivity. If the contrary were true so that all of the structures in one resistive leg were under a single quarter segment of the winding, and all of the structures in another resistive leg were under the opposite single quarter segment of the winding, the sensitivity of one would increase while that of the other would decrease.

The planar winding formed by second biasing coil lines 29, in either adjusting the operating point of the sensor (changing where "zero" field is) or in providing linear feedback, as indicated above, affects the output signal from the sensor in a manner that is dependent on the algebraic sign of the magnetic field generated by current therethrough. Hence, the tunnel junction structures 23 which are to sense this field are positioned under only one of the quarter segments of this winding. In being used with concentrator-shields 31, this winding must be arranged such that interconnected assemblages of tunnel junction structures 23 that are to be shielded do not experience any of the magnetic fields generated by current through this winding. In addition, this winding should be constructed so that it has a minimal and balanced effect on concentrator-shields 31. The problem here is that the unused quarter segments of the winding end up being under concentrator-shields 31. The coil lines of this winding is made much wider where they pass under the concentrator-shields 31 than where they pass over those interconnected assemblages of tunnel junction structures 23 that are to experience magnetic fields generated by currents through that winding. This is because magnetic fields under the winding are directly proportional to the current densities in the coil lines of that winding which are inversely proportional to the coil line width at a given point in the winding.

The resulting tunnel junctions in a sensor cell can be characterized by various parameters. An important parameter for sensor cells is the intrinsic resistance-capacitance time constant of the device due to that barrier layer 14 resulting therein from the fabrication process of the cell. The cell capacitance, C, can be approximately determined for the cell from $$C = 8.85 \cdot 10^{-18} \cdot 8 \cdot 10^{-6} A/s$$

where A is the area in square microns and s is the thickness of the aluminum oxide portion of barrier layer 14 in microns and a dielectric constant of 8 has been taken as the value appropriate for the aluminum oxide of barrier layer 14. As indicated above, for relatively low voltages across the cell (100 mV or less), the effective resistance through the cell, R, will typically be on the order of $10^4$ to $10^9 \Omega$. The resistance of this portion of the barrier layer can be approximated by $$R = k_1 s e^{k_2 s}$$

where $k_1$ and $k_2$ are constants characterizing the barrier layer material and s again is the thickness of that layer in microns. As a result, the resistance-capacitance time constant which is the product of R and C will then be exponentially dependent on the thickness s of the aluminum oxide portion of barrier layer 14. This time constant product can be reduced by reducing the thickness of the aluminum oxide portion of barrier layer 14 until $k_2 s$ is much smaller than 1, or, as a practical matter, until difficulties in the fabrication process of thin barrier layers prevent further reductions in the thickness thereof.

A further lengthening in the minimum time to retrieve data from a sensor cell will be due to the voltage measuring circuitry across the cell involving a sensing amplifier to detect the change in the output voltage of that cell when the magnetizations of the ferromagnetic layer are changed from more parallel to one another to being more antiparallel.

The sensor structure described above through interconnections 25 and insulating layer 26 thereover, i.e. omitting first biasing coil lines 27 and second biasing coil lines 29 and concentrator-shield 31, but with a 125 Å layer of CoFe substituted for compound ferromagnetic layer 15,16,17 and IrMn pinning layer 18, can typically achieve a 25% JMR at room temperature. However, the resistance versus external magnetic field characteristics of such a device are not particularly good for sensing values of such external magnetic fields due to such a sensing structure exhibiting substantial hysteresis and other nonlinearities. Consequently, the full sensor structure described above is instead used to thereby reduce or eliminate such difficulties. This is achieved in this full structure because of its more reorientation resistant antiferromagnetic pinning mechanism in the top tunnel junction electrode therein, provided by IrMn pinning layer 18 pinning the magnetization orientation of antiferromagnetically coupled compound ferromagnetic layer 15,16,17, and because of its orthogonal biasing scheme for the bottom electrode provided by first biasing coil lines 27 and second biasing coil lines 29.

Replacing a simple thick CoFe ferromagnetic "hard" (relatively high coercivity) layer for the top tunnel junction electrode with the antiferromagnetic pinning mechanism simplifies the magnetic behavior of the cell. In the small value external magnetic fields sought to be sensed, the magnetic behavior of a tunnel junction structure is just that of composite ferromagnetic "soft" (relatively small coercivity) layer 12,13 forming the bottom tunnel junction electrode, since the top electrode magnetization direction remains rigidly oriented in the direction set by pinning layer 18 because such external fields are far too small to have a significant effect thereon. The magnetization of composite ferromagnetic soft layer 12,13 in the bottom electrode, having its easy axis parallel to the top electrode magnetization direction, is relatively free, on the other hand, to rotate under the influence of an external magnetic field.

Figure 3:
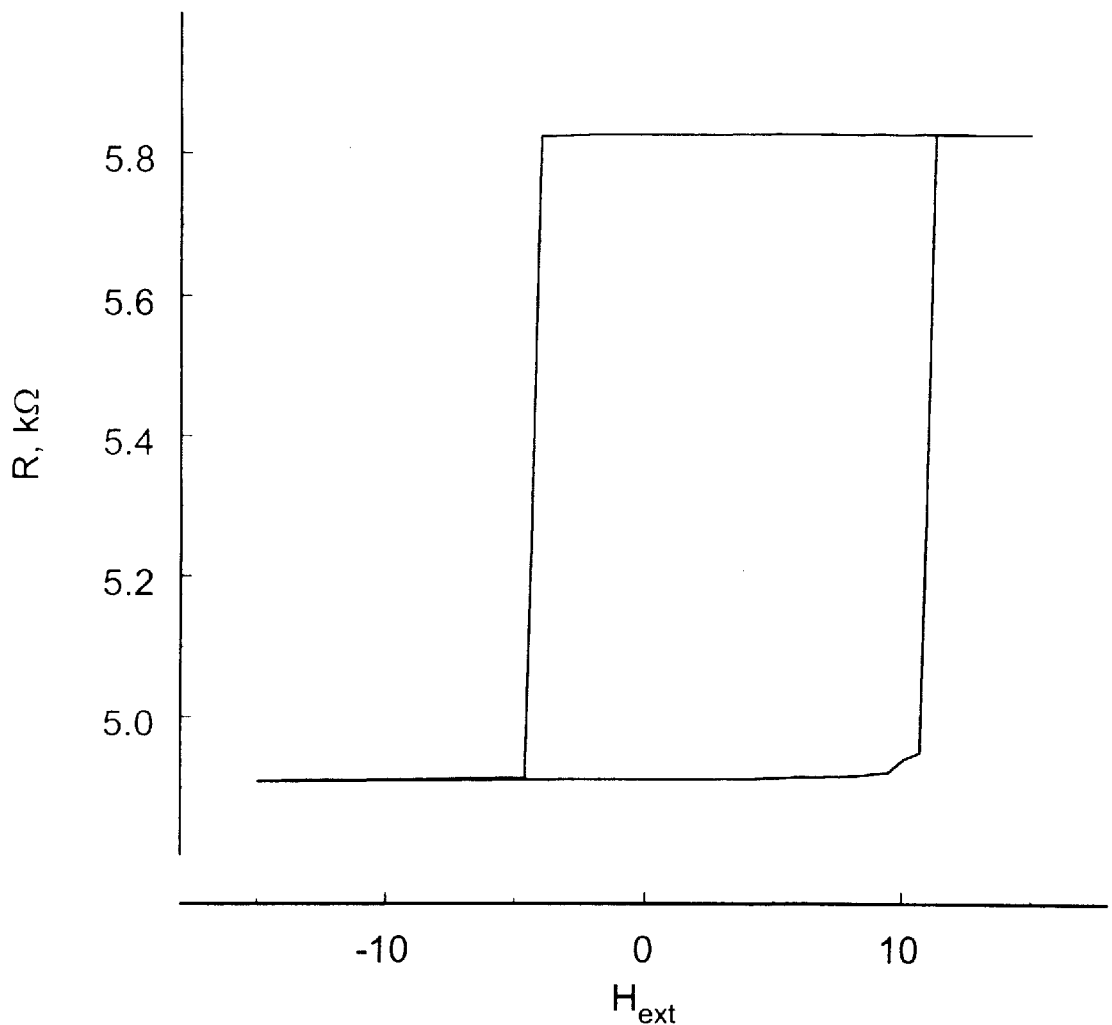
FIG. 3 represents a characteristic diagram for structures similar to those of FIGS. 1 and 2 in one mode of operation.

The resistance of such a tunnel junction structure as described above in response to external magnetic fields directed along the top electrode magnetization direction, i.e. along the easy axis of the bottom electrode, in the absence of any biasing of the magnetization direction of the bottom electrode (no current in biasing lines 27 and 29) is shown in FIG. 3. The result is a sort of a "square" magnetoresistance versus external field characteristic. This plot shows that the change from the minimum resistance value for the tunnel junction to the maximum value therefor, and vice verse, as the external magnetic fields rotate the direction of magnetization of composite ferromagnetic soft layer 12,13 of the bottom electrode occurs over very small ranges of these external fields, and changes very uniformly over those ranges. In fact, obtaining such a response using instruments with greater magnetic field resolution indicates that this entire resistance shift between minimum and maximum values therefor, and vice verse, occurs over ranges of the external magnetic fields that are so small as to be less than 100 mOe in extent.

Unfortunately, these small ranges in the external magnetic fields range at which such shifts in resistance value between the maximum and minimum values thereof occur at locations which vary a few Oe from one another from one such shifting to the next, and this variation locations at which these shifts occur effectively results in an equivalent noise signal. Thus, an improved operating mode is desired for such a magnetic field sensor for sensing small external magnetic fields. In such a mode, the main objective would be to cause the magnetization directional response to external magnetic fields of composite ferromagnetic soft layer 12,13, and so the tunnel junction resistive response, to follow a smooth curve with respect to corresponding changes in the external magnetic fields being measured over a significant range of such fields, and for this curve to be a single-valued function of those measured fields.

A low dispersion film has been found to be very sensitive to external magnetic fields directed along the pinned magnetization axis of the top electrode, or the easy direction of composite ferromagnetic layer 12,13 of the bottom electrode, when the magnetization of layer 12,13 is biased in the hard direction, i.e. perpendicular to the pinned magnetization axis of the top electrode, using a field slightly greater than the anisotropy field associated with the easy axis of layer 12,13. Such a field can be provided by providing a suitably selected current through biasing coil lines 27 as described above. Dispersion is a description of the lack of directional uniformity with respect to the easy axis in a sample of ferromagnetic material along that axis. Generally, such a ferromagnetic material will typically consist of many material crystallites, each of which will have a crystallographic orientation and a preferred magnetic orientation (easy axis of the crystallite). The crystallographic axes or the magnetic easy axes, or both, of such crystallites typically will not be perfectly aligned with respect to those in adjacent crystallites resulting in dispersion.

In practice, dispersion can be measured in a flux versus magnetic intensity specimen measurement and plotting system (B–H loop tracer). A low value of dispersion is 1 degree of rotation or less of the excitation field from the specimen hard axis for the angle required to decrease the responsive flux to 90% of the magnetic saturation value from full saturation. A soft magnetic film with low dispersion, if magnetically saturated along the hard axis thereof, rotates in the presence of externally applied magnetic fields as a single domain with little or no hysteresis. The biasing arrangement for the sensor described above relies on this property of composite ferromagnetic layer 12,13, and a representation of the magnetizations of the layers and the geometrical coordinates is depicted in FIG. 4 for a tunnel junction structure of the kind described above.

Figure 4:
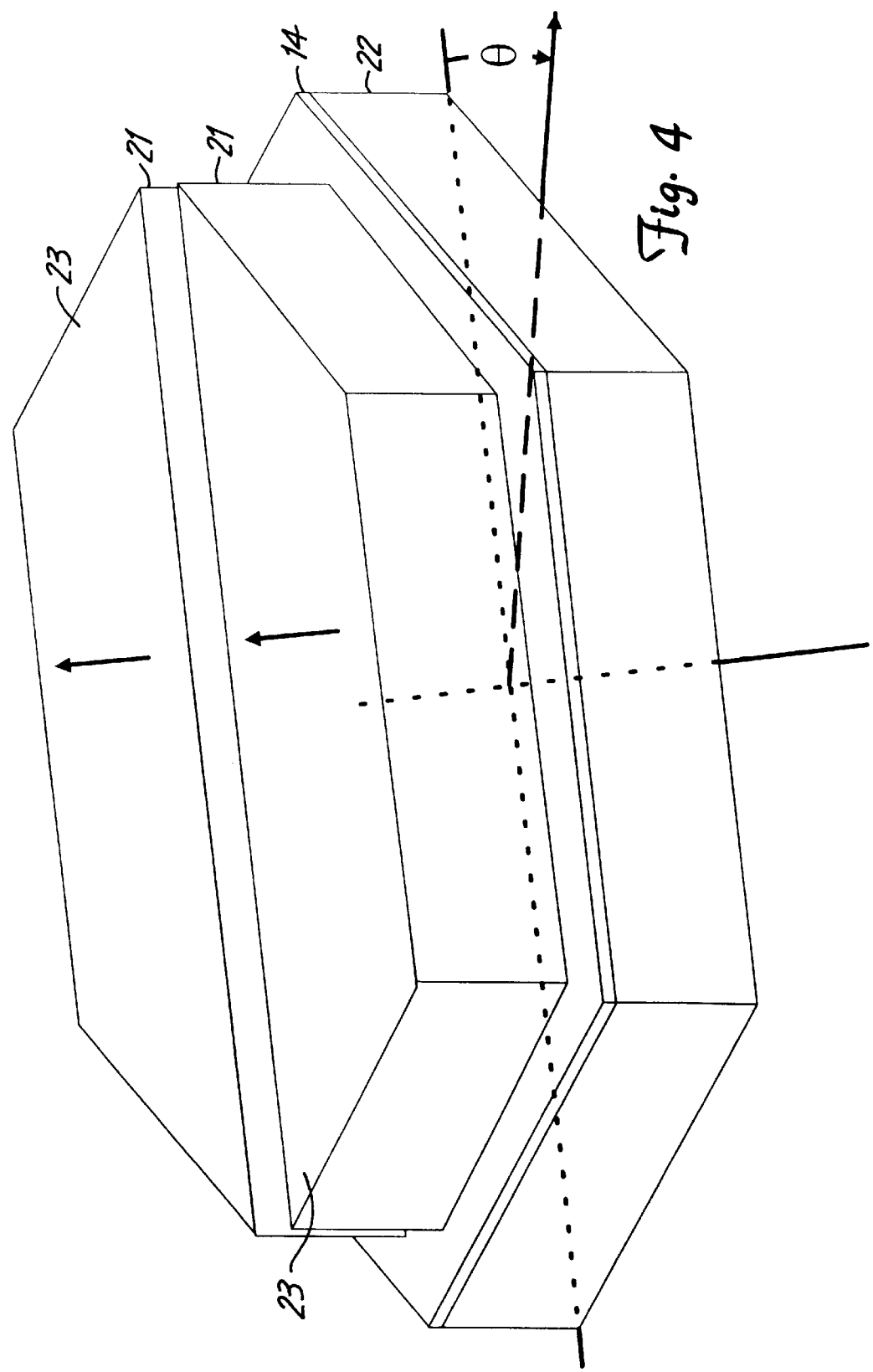
FIG. 4 represents a simplified perspective view from of a structure from FIGS. 1 and 2.

The orthogonal biasing of composite ferromagnetic soft layer 12,13 of the bottom electrode of this tunnel junction structure is used in conjunction with compound ferromagnetic hard layer 15,16,17 of the top electrode having its magnetization fixed in a direction by layer 18 and, as a result, hard layer 15,16,17 can be taken as having its magnetization fixed at an angle θ=−90° in FIG. 4. Then soft layer 12,13 will rotate as a single domain under the influence of externally applied magnetic fields to have an angular dependence on such fields with this angle represented as θ in FIG. 4. In this situation, the tunnel junction resistance between soft layer 12,13 and hard layer 15,16,17 follows the functional form $$R = R_{par} + (\Delta R/2)[1 + \sin(\theta)]$$

where $\Delta R$ is the magnitude of the difference in tunnel junction resistance in this tunnel junction structure as the angle between the magnetizations of the soft and hard layers goes from parallel to antiparallel. $R_{par}$ and $R_{anti}$ represent the resistances when the magnetizations of these two layers are oriented parallel and antiparallel, respectively. Thus, $$\Delta R = R_{anti} - R_{par}$$

Differentiating twice the expression above for R with respect to θ and setting the result to zero shows that the greatest slope thereof occurs at θ=0. Consequently, if soft layer 12,13 of the tunnel junction structure has its magnetization biased orthogonally to that of hard layer 15,16,17, the resistance of this tunnel junction R(θ) is at its most sensitive point for very small external fields.

Figure 5:
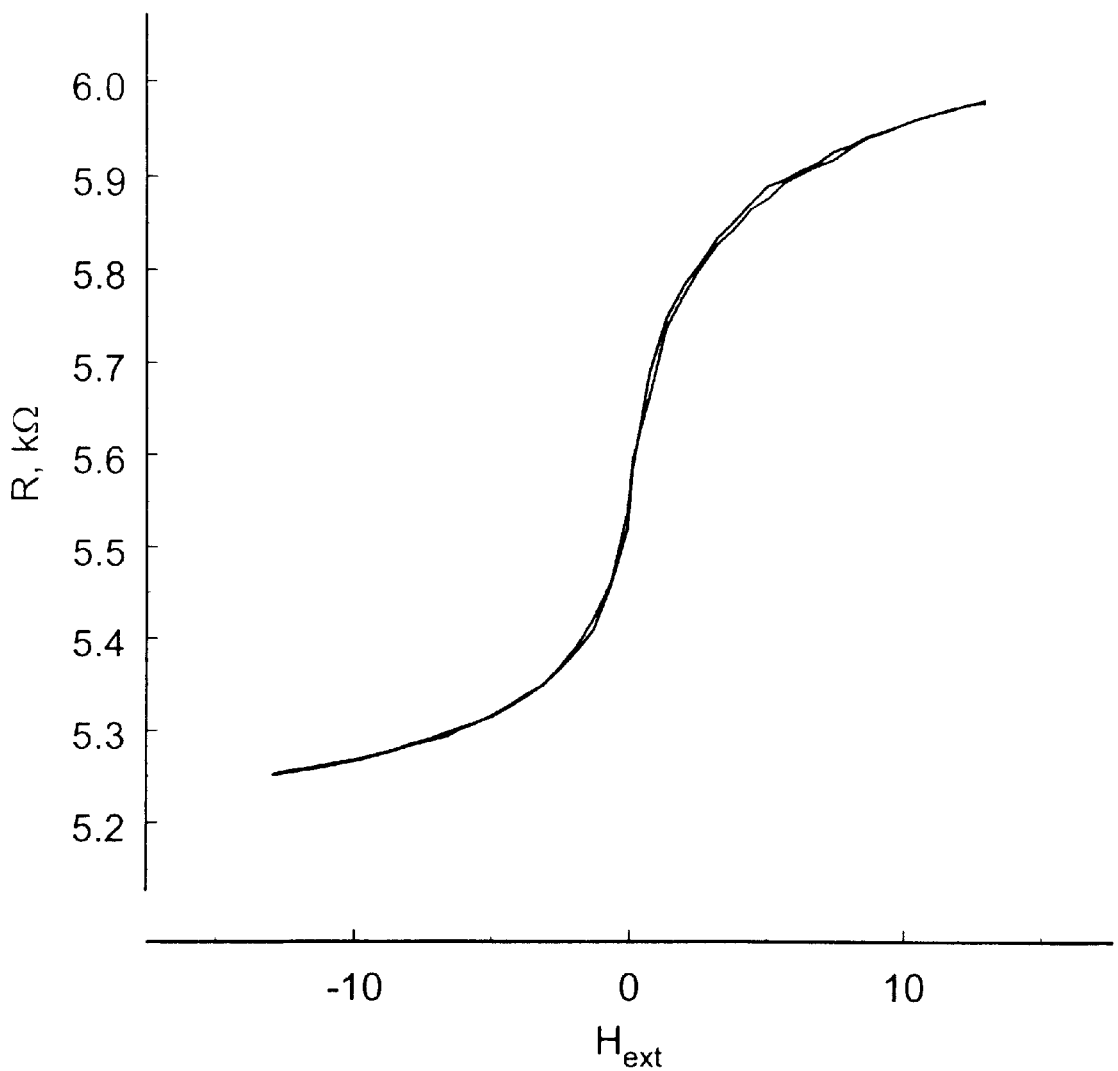
FIG. 5 represents a characteristic diagram for structures similar to those of FIGS. 1 and 2 in another mode of operation.

The plot shown in FIG. 5 is based on data obtained from a tunnel junction structure biased in this manner. The device was in the wafer in which it was fabricated, and the biasing was done with a permanent magnet positioned about 50 mm above the wafer as a biasing alternative to the use of biasing lines. The magnitude of the field due to this magnet was about 20 Oe. The magnet was oriented such that most of the field provided thereby was perpendicular to the pinned magnetization axis of hard layer 15,16,17, but rotated just enough so that the interlayer coupling was canceled by the easy axis component. One can see that the region near zero field has a very steep slope (3%/Oe) with very little hysteresis. The resulting resistance versus external magnetic field behavior has little hysteresis, is very sensitive about the zero external field point, and has usable linearity about the zero external field point.

Connecting N similar tunnel junction structures together to make a sensor increases the fundamental signal to noise ratio by $\sqrt{N}$, whether the structures are connected together in series or parallel circuits. Typical parameter values allow making a determination of a sensor configuration for a particular tunnel junction structure.

The noise voltage, $V_n$, for a single tunnel junction structure is taken as being the Johnson noise for a resistor of equal value, R. Each tunnel junction structure will be assumed to be operated with a fixed voltage, Ve, thereacross. Each tunnel junction structure is assumed to have an intrinsic sensitivity, S, to an applied field with units of V/Oe.

The Johnson noise is given by $$V_n = \sqrt{4kTR\Delta f} \text{ volts, rms}$$

where k is the Boltzmann's constant, T is the absolute temperature in K, R is the resistance in ohms, and $\Delta f$ is the noise bandwidth in Hz. Assuming a constant temperature and bandwidth, the noise of a single tunnel junction structure may be written as $$V_n = C\sqrt{R}, \text{ where } C = \sqrt{4kT\Delta f}.$$

The signal in a single tunnel junction structure with sensitivity S, due to an applied field, H, is $V_\theta = SH$, so the signal to noise ratio for a single element is $$S:N_1 = \frac{SH}{V_n} = \frac{SH}{C\sqrt{R}}.$$

The noise of N tunnel junction structures in connected series is then $$V_n(N \text{ in series}) = C\sqrt{RN}$$

while the noise of N tunnel junction structures connected in parallel is $$V_n(N \text{ in parallel}) = C\sqrt{\frac{R}{N}}.$$

The signal of N tunnel junction structures connected in series is NS, while the signal from N tunnel junction structures connected in parallel is still S. Thus, the S:N ratios at a field H for N tunnel junction structures connected in series and parallel are $$S:N_{Nseries} = \frac{NSH}{V_n(N \text{ in series})} = \frac{NSH}{C\sqrt{RN}} = \frac{SH}{C}\sqrt{\frac{N}{R}}$$

$$S:N_{n\,parallel} = \frac{SH}{V_n(N \text{ in parallel})} = \frac{SH}{C}\sqrt{\frac{N}{R}}.$$

Hence, the S:N ratio of N tunnel junction structures increases as $\sqrt{N}$ whether the tunnel junction structures are connected in series or in parallel. The S:N ratio of one tunnel junction structure may be calculated using the following convenient values in the equation for $SN_1$ given above S=0.02 V/Oe (20%/Oe at 100 mV bias voltage)
H=1×10⁻⁸ Oe (desired minimum detectable field)
Δf=1 Hz
T=300 K
k=1.38×10⁻²³ J/K
C=1.29×10⁻¹⁰ Volts
R=100Ω to yield

S:N₁ (10⁻⁸ Oe)=0.155.

Thus, using an array of 49 of these tunnel junction structures (7×7) the S:N ratio at $10^{-8}$ Oe would increase by a factor of 7 to 1.05 (7 times 0.155). To have a S:N ratio of 10:1 with these structures, approximately 5000 of them would be required ($\sqrt{4900}=70$). A tunnel junction structure with R=100Ω of a material having a typical tunnel resistivity ($\rho_T$) of 0.1 MΩ-$\mu$m² has an area of 1000 $\mu$m² (for example, provided by structure with dimensions of 25 by 40 $\mu$m). An array of 5000 tunnel junction structures, then, requires $5 \times 10^3 \times 10^3 = 5 \times 10^6$ $\mu$m² or 5 mm². Since each structure will be operated at 0.1 V for maximum signal output and has, as indicated, a resistance of 100Ω, each structure consumes 0.1 mW for a total of 500 mW for such an array whether these structures are connected in series or parallel circuits.

Reviewing the equation above for S:N₁ makes clear that increasing the number of tunnel junction structures is not the only way to increase the fundamental signal to noise ratio. Decreasing the resistance per tunnel junction structure will also have a square root dependence. This may be done by increasing the size of the tunnel junction structures or by decreasing $\rho_T$. A typical value for this tunnel resistivity is 0.1 MΩ-$\mu$m² although there have been fabricated tunnel junction structures exhibiting 0.01 MΩ-$\mu$m². There is certainly a limit to how low this parameter can go. A 0.1 MΩ-$\mu$m² tunnel junction structure has a barrier of roughly 15 Å thickness, and every 2 Å thinner corresponds to approximately a factor of 10 decrease in $\rho_T$. However, making barriers thinner also increases the difficulty of fabricating them with no pinholes, and they will be more fragile. Another practical limitation is that contact resistance will degrade the percentage signal if it is on the same order as the element resistance. Assuming a fixed voltage across tunnel junction structures, the power consumption increases linearly with both N and $1/\rho_T$. Consequently, trying to reduce $\rho_T$ is better because then the resulting sensor can be smaller for the same power and sensitivity. Lowering the temperature has two benefits in that the percentage signal goes up while the thermal noise goes down. One could expect to approximately double the signal to noise ratio by operating at 77° K.

The signal-to-noise ratio of a tunnel junction structure always varies as $\sqrt{\text{Power}}$ when varying a single parameter while holding the others fixed. For instance, holding $\rho_T$ and the number of elements fixed, if there is no noise (such as current-dependent 1/f noise) above the thermal noise, the signal can be increased by increasing the bias voltage (and consequently, the junction current), but the power also increases. Assuming changes in resistance versus changes in the external magnetic field can be expressed as dR/dH, the voltage signal for a tunneling current I is Signal=I*dR/dH with Noise=(constant). As is well known, the power dissipated in the structure resistance R is Power=I²R. Thus, the signal-to-noise ratio is linear in I while the power goes as I², and so the signal-to-noise ratio is proportional to $\sqrt{\text{Power}}$ when independently varying the bias voltage (reflected by the varying junction current). In practice, the bias voltage is limited to about 100 mV because dR/dH drops off at higher bias voltages.

Next, hold the bias voltage and number of elements fixed while varying $\rho_T$. This variation has no effect on the signal so that Signal=(constant), but the noise depends on the resistance so that Noise $\sqrt{R}$ $\sqrt{\rho_T}$ because the resistance of the device is proportional to $\rho_T$. Again, as is well known, Power=V²/R, so that the signal-to-noise ratio is $1/\sqrt{\rho_T}$ but the power $1/\rho_T$, leaving the signal-to-noise ratio $\sqrt{\text{Power}}$ when independently varying $\rho_T$.

Finally, hold the bias voltage and $\rho_T$ fixed while varying N, the number of tunnel junction structures. As shown above, the signal-to-noise $\sqrt{N}$, but the power N. So again, the signal-to-noise ratio $\sqrt{\text{Power}}$ when independently varying N.

The area a sensor uses on a substrate provided by an underlying monolithic integrated circuit determines how many different sensors can be fabricated on a single wafer, and what size the integrated biasing coils and flux concentrators must be. As shown above, the power consumed by the sensor during operation thereof is a direct indicator of the signal-to-noise ratio. As a result, the power used is directly proportional to the substrate area used for the sensor, assuming the voltage per tunnel junction and $\rho_T$ are fixed. In other words, one could have 100 tunnel junction structures of 1600 square microns area each, or one tunnel junction structure with an area of 160,000 square microns and still have the same signal-to-noise ratio. Each arrangement will require different circuit interconnections to be made. The second arrangement, the single tunnel junction structure arrangement, uses an area of 160,000 square microns. The first arrangement, the 100 tunnel junction structures arrangement, uses an area of 160,000 square microns plus some otherwise unused space between structures when dividing the area up to support multiple structures. (This unused area is generally less than 20% of the total area consumed by a multiple element sensor.) The main benefit of having more than one tunnel junction structure in a sensor is that higher signal voltages can be obtained by connecting the elements in a series circuit.

Although, a tunnel junction structure as described above has a relatively linear tunnel current versus junction voltage characteristic for voltages less than 100 mV, the characteristic is a nonlinear function of junction voltage. For higher voltages across the junction, the this characteristic becomes more parabolic with disproportionately higher junction current required to result in an increased junction voltage. At a junction voltage of about 2 V, there is typically a catastrophic breakdown of the tunnel junction which is irreparable insofar as restoring the junction so as to have its previous characteristic, the junction thereafter behaving as a low resistance conductor. Related to this nonlinear tunnel current versus junction voltage characteristic is that the magnetoresistance (ΔR/R) magnitude change in response to changes in external magnetic fields being sensed thereby decreases rapidly for operating voltages above 100 mV across a single junction structure.

Consequently, the desire to have maximum sensitivity to changes in the external magnetic fields to be sensed means that the operating voltage across the tunnel junction of a tunnel junction structure should be maintained to be 100 mV or less. Better tunnel junction structures are likely to be fabricated in the future such that a junction voltage can be of a higher value, perhaps as much as 500 mV. Nevertheless, there will always be some maximum operating junction voltage that should be used, and some junction breakdown voltage.

A magnetic field sensor that can withstand higher operating voltages thereacross and provide a greater output signal and a greater signal-to-noise ratio, though requiring a greater power dissipation, can be formed, as indicated above, by connecting many tunnel junction structures in a series circuit. An additional advantage to forming a sensor with many tunnel junction structures connected in series is that if one junction suffers a catastrophic breakdown to thereby become a conductor, the sensor will still be operable though degraded to the extent of having one fewer tunnel junction structure sensing external magnetic fields and dropping a significant voltage thereacross.

As an example, a sensor with a total voltage thereacross of 2 V would require a series connection of 20 tunnel junction structures in series with one another with each having a voltage drop of about 100 mV if they have very similar tunnel current versus junction voltage characteristics. This arrangement is in contrast to a standard "giant magnetoresistive effect" sensor where the total resistance is typically controlled by making a single serpentine resistor longer or shorter as needed, and the maximum operating voltage thereacross is limited only by the heating during use associated with its current versus voltage characteristic. If multiple tunnel junction structures are connected together in a circuit, or if multiple "giant magnetoresistive effect" structures are connected together in a circuit, the kind of circuit chosen for such a purpose determines the net circuit resistance of the combination and the maximum optimal voltage at which the combination can operate: N parallel conduction paths of resistance R each have a net circuit resistance of R/N, while N series resistance paths of resistance R have a net circuit resistance of RN.

Typically, some sort of a bridge circuit is used to provide a tunnel junction structure based sensor clearly implying that at least two or more tunnel junction structures will be used in providing such a sensor. However, the actual number of tunnel junction structures used in each leg of the bridge circuit, i.e. the number of such structures connected in series for that leg, is determined by the voltage that is required to occur across the bridge circuit in the sensing system as set by system circuit design considerations. As an example, a typical operational amplifier is operated with supply voltages having high and low voltage values of 10.0 V and 0.0 V, respectively. In this situation, the sensor bridge circuit having its outputs connected to the inputs of the operational amplifier will typically be operated with essentially the full supply voltage available provided thereacross, that is, 10 V. Each leg of the bridge circuit then, when balanced, would have 5 V across it, and thus would require at least 50 substantially similar tunnel junction structures connected in series with one another to have no more than 100 mV dropped across any one of them.

A bridge circuit for sensing uniform external magnetic fields requires adjacent resistive legs of that circuit to behave differently to develop a corresponding field magnitude based output signal as known from U.S. Pat. No. 5,617,071 hereby incorporated by reference herein. Thus, adjacent resistive legs must either have different resistive versus external magnetic field characteristics, or the external magnetic field present at one must not be identically present at the other. The latter situation can be provided by use of a concentrator-shield 31 positioned over one resistive leg to shield it from external magnetic fields and positioned near to, but not over, the adjacent resistive leg to thereby concentrate the external magnetic field present thereat. Typically, a four resistive leg bridge is used with a pair of concentrator-shields 31 so as to have each of two of the bridge resistive legs under a corresponding one of the pair of concentrator-shields 31 and the remaining two resistive legs positioned in a small gap between the members of that concentrator-shield pair.

The resistive versus external magnetic field characteristics of those tunnel junction structures 23 in adjacent resistive legs can alternatively be differentiated if each of these legs is positioned under an opposite segment of second biasing coil lines 29 by reorienting, as needed, the direction of magnetizations of pinning layer 18, and so of pinned hard layer 15, 16, 17, of the tunnel junction structures 23 in one of these legs so that they are antiparallel to those in the other. This can be accomplished heating tunnel junction structures 23 in these legs above the Nèel temperature of layer 18, and then letting them cool while current is supplied through second biasing coil lines 29.

In the tunnel junction structures described above in connection with FIGS. 1 and 2, all of the output voltage signal due to tunnel junction resistance changes corresponding to changes in the external magnetic fields being sensed thereby comes from electrons tunneling across barrier layer 14 from compound ferromagnetic hard layer 15,16,17 in the top electrode to composite ferromagnetic soft layer 12,13 in the bottom electrode. Consequently, regions of soft layer 12,13 which are not located directly across barrier layer 14 from hard layer 15,16,17, but are instead located peripherally thereto, do not directly affect the magnetoresistive properties of the tunnel junction structures. These peripheral portions of soft layer 12,13 not located directly across barrier layer 14 from hard layer 15,16,17 do, however, have an indirect effect through whatever magnetic coupling there is between them and the remaining portions of soft layer 12,13 that are located directly across barrier layer 14 from hard layer 15,16,17. This coupling is the usual strong exchange coupling present in any ferromagnetic material. To the extent that the directly across soft layer 12,13 portions are coupled to the soft layer 12,13 peripheral portions, the magnetic behavior of those peripheral portions must be of concern.

As a result, hard layer 15,16,17 should be smaller in its lateral extent than the lateral extent of soft layer 12,13 so as to be an "island" on soft layer 12,13. Then whatever magnetic edge effects occur at the edges of soft layer 12,13 will not directly affect the spin dependent tunneling that is to occur across barrier layer 14 through altering the perpendicular magnetization bias described above. These magnetic edge effects could be as minimal as edge curling, which extends into the film from the edges of soft layer 12,13 about 1 μm or less, or as serious as the formation of edge domains which can extend across significant fractions of the surface of soft layer 12,13 supporting barrier layer 14. Edge curling of soft layer 12,13 occurs when that composite magnetic film is not completely magnetized by the perpendicular biasing field provided by currents through first biasing coil lines 27 and second biasing coil lines 29 (or alternatively, a permanent magnet provided in the sensor or in the housing for the sensor).

Because of demagnetizing fields due to free poles at the edges of a magnetized thin-film, magnetizing the central regions of that film is often easier than magnetizing the edges. Magnetic moments along the edges of the film prefer to lie parallel to the edge, in the plane of the film, to reduce the film magnetostatic energy. Edge domains occur when these edge effects are strong enough to make it energetically favorable to form a domain wall in the body of the film. Edge curling may be thought of as a partial domain wall containing rotated spin orientations that rotate to align with the bulk material spin orientations to thereby leave no domain on the other side.

The tendency of domain walls to form in soft layer 12,13 in the tunnel junction structures described above is reduced by positioning each structure therein closely to its adjacent structures, and by the shape chosen for each such structure insofar as its lateral extent. In addition, the uniformity of the structure magnetizations across the array is also enhanced. These structures in the array are magnetically coupled to one another as described below even though they are sufficiently separated to be electrically isolated from neighboring structures.

In the tunnel junction structures described above in connection with FIGS. 1 and 2, composite ferromagnetic soft layer 12,13 in the bottom electrode extends beyond the edges of, and supports through barrier layer 14, compound ferromagnetic hard layer 15,16,17 in the top electrode. This arrangement permits supporting two tunnel junction structures on a single barrier layer 14 and corresponding single soft layer 12,13 in the bottom electrode to thereby allow convenient interconnection of many tunnel junction structures in series with one another without having to directly contact the bottom electrode with first metal layer interconnections 25. Alternatively, omitting a tunnel junction structure so that only one such structure is supported on a single barrier layer 14 and corresponding single soft layer 12,13 in the bottom electrode permits conveniently directly contacting the bottom electrode with first metal layer interconnections 25. Further, this arrangement provides dependable patterning in the tunnel junction structure fabrication process by avoiding needing to have vertical edges of the top electrode aligned with vertical edges of the bottom electrode which would too often lead to unwanted metal occurring across the vertical edge of the barrier layer thereby electrically short circuiting the top and bottom electrodes. In addition, as described above, the edge effects in soft layer 12,13 are less of a factor because of the edges of that layer being removed to a significant extent from the portions of barrier layer 14 through which tunneling is occurring. As indicated above, FIG. 1A shows a plan view of an example of such an array of tunnel junction structures supported in pairs on bottom electrodes.

Alternatively, or in conjunction with close spacing, edge curling can be reduced or eliminated within soft layer 12,13 of a tunnel junction structure by choosing the shape outline of the lateral extent of that layer to follow the shape of the overlap portion of two circles having centers offset from one another by less than the diameter of either. As is well known, an ellipsoid which is uniformly magnetized has uniform demagnetization fields therein. This condition is consistent with the absence of edge curling. Thus, this two circle overlap shape, because it is the 2-dimensional analog of a 3-dimensional ellipsoid, is desirable for its consistency with the absence of edge curling in a saturated flat ferromagnetic thin-film.

Reducing the tunnel resistivity of a tunnel junction structure will increase the signal-to-noise ratio of that structure, and of a sensor formed of an array of such structures. The total resistance of the tunnel junction structure, and approximately that of the sensor, will be reduced by the same factor as the factor of such a resistivity reduction. Since the thermal noise is proportional to the square root of the structure resistance R, a reduction in tunnel junction resistivity $\rho_T$ of a selected factor results in an increase in signal to noise by the square root of that selected factor. A limit to such a reduction in $\rho_T$ occurs when the transverse electrode resistance of the top and bottom electrodes in the tunnel junction structure becomes comparable to the vertical tunnel resistance. This situation is shown in FIG. 6.

In situations in which the resistance of barrier layer 14 is high relative to the top and bottom electrodes, the current spreads out in the top and bottom electrodes before tunneling through barrier layer 14. Little voltage drop occurs in these electrodes and nearly all the voltage drop occurs across barrier layer 14. Consequently, the relative signal ΔR/R is maximized.

In the relatively low barrier resistance situation, current follows a more diagonal path through the tunnel junction. There are significant voltage drops within the top and bottom electrodes which contribute to R but not to ΔR. Consequently, the measured ΔR/R is reduced from the maximum value. FIG. 6 shows the different current paths in these two extremes.

Such a result can be mitigated by making the sheet resistance of the top and bottom electrode smaller. One can make the ferromagnetic thin-films therein thicker, or have a nonmagnetic conducting layer such as Al, Cu, Pt, etc. against and across the ferromagnetic layers therein to aid in conducting current away from the tunnel junction. An additional mitigating technique is to reduce the in-plane current path resistance by making the connections from tunnel junction structure to tunnel junction structure in the array be as short as possible and wider. Thus, interconnections 25 in FIG. 1A between adjacent tunnel junction structures 23 extend between them parallel to the widths of these structures so that such interconnections can be nearly as wide as the interconnected structures are long. Furthermore, the top electrodes in these adjacent interconnected structures can be contacted by interconnections 25 extending parallel to the widths of those structures all along the length of their top electrodes without adding to the lengths of interconnections 25 as would be required if those structures alternatively were interconnected from end to end. These structures and interconnections as used in a bridge circuit are shown in FIG. 7.

Although the present invention has been described with reference to preferred embodiments, workers skilled in the art will recognize that changes may be made in form and detail without departing from the spirit and scope of the invention.

We claim:

1. A ferromagnetic thin-film based magnetic field sensor, said sensor comprising:
   a plurality of junction structures electrically interconnected through a first common base electrode, said junction structures comprising:
      a first electrically insulative intermediate layer, said intermediate layer having two major surfaces on opposite sides thereof;
      a first base magnetizable film of an anisotropic ferromagnetic material in said first common base electrode and on a said major surface on a first common base electrode side of said first intermediate layer, said base magnetizable film having a magnetization for a selected external field present thereat; and
      a first plurality of separated magnetizable films of an anisotropic ferromagnetic material at least one of which is on that remaining one of said major surfaces of said first intermediate layer, said separated magnetizable films having magnetizations which each rotate to an angle for said selected external magnetic field present thereat differing from that angle to which said magnetization of said first base magnetizable film rotates for said selected external magnetic field present thereat.

2. The apparatus of claim 1 wherein said first base magnetizable film has a length along a selected direction and a width that is smaller in extent than said length and has a shaped end portion extending over a portion of said length in which said width gradually reduces to zero at an end thereof.

3. The apparatus of claim 1 further comprising a first coil spaced apart from said first plurality of separated magnetizable films.

4. The apparatus of claim 1 further comprising:
   a second plurality of junction structures electrically interconnected through a second common base electrode supported on a common substrate with said first common base electrode, said junction structures comprising:
      a second electrically insulative intermediate layer, said second intermediate layer having two major surfaces on opposite sides thereof;
      a second base magnetizable film of an anisotropic ferromagnetic material in said second common base electrode and on a said major surface on a second common base electrode side of said second intermediate layer, said second base magnetizable film having a magnetization for a selected external magnetic field thereat; and
      a second plurality of separated magnetizable films of an anisotropic ferromagnetic material at least one of which is on that remaining one of said major surfaces of said second intermediate layer, said separated magnetizable films in said second plurality thereof having magnetizations which each rotate to an angle for said selected external magnetic field present thereat differing from that angle to which said magnetization of said second base magnetizable film rotates for said selected external magnetic field present thereat, a said separated magnetizable film in said second plurality thereof being electrically interconnected with a said separated magnetizable film in said first plurality thereof.

5. The apparatus of claim 1 wherein all of said separated magnetizable films in said first plurality thereof are provided on said first intermediate layer.

6. The apparatus of claim 1 wherein whichever of said first base magnetizable film and said first plurality of separated magnetizable films has said magnetization thereof rotated to a greater angle for said selected external magnetic field present thereat also has an easy axis along that direction followed by that said magnetization least rotated for said selected external magnetic field present thereat.

7. The apparatus of claim 1 wherein whichever of said first base magnetizable film and said first plurality of separated magnetizable films has said magnetization thereof rotated to a greater angle for said selected external magnetic field present thereat also has an easy axis across that direction followed by that said magnetization least rotated for said selected external magnetic field present thereat.

8. The apparatus of claim 1 further comprising having said first plurality of separated magnetizable films positioned between said first common base electrode and a permeable mass serving as a magnetic field concentrator therefor.

9. The apparatus of claim 1 wherein whichever of said first base magnetizable film and said first plurality of separated magnetizable films has said magnetization thereof rotated to a smaller angle for said selected external magnetic field present thereat has provided thereon a pinning structure comprising an antiferromagnetic material.

10. The apparatus of claim 1 wherein at least one of said first plurality of separated magnetizable films has all portions thereof located farther inwardly from edges of said first intermediate layer than is any portion of said first base magnetizable film by at least a curling distance of said first base magnetizable film.

11. The apparatus of claim 1 wherein said first common base electrode has a nonmagnetic, electrically conductive support on which said first base magnetizable film is provided.

12. The apparatus of claim 2 wherein a said separated magnetizable film in said first plurality thereof has a length along a selected direction and a width that is smaller in extent than said length and has a shaped end portion extending over a portion of said length in which said width gradually reduces to zero at an end thereof.

13. The apparatus of claim 3 further comprising a second coil spaced apart from said first coil.

14. The apparatus of claim 12 further comprising:
   a second plurality of junction structures electrically interconnected through a second common base electrode supported on a common substrate with said first common base electrode, said junction structures comprising:
      a second electrically insulative intermediate layer, said second intermediate layer having two major surfaces on opposite sides thereof;
      a second base magnetizable film of an anisotropic ferromagnetic material in said second common base electrode and on a said major surface on a second common base electrode side of said second intermediate layer, said second base magnetizable film having a magnetization for a selected external magnetic field thereat; and a second plurality of separated magnetizable films of an anisotropic ferromagnetic material at least one of which is on that remaining one of said major surfaces of said second intermediate layer, said separated magnetizable films in said second plurality thereof having magnetizations which each rotate to an angle for said selected external magnetic field present thereat differing from that angle to which said magnetization of said second base magnetizable film rotates for said selected external magnetic field present thereat, a said separated magnetizable film in said second plurality thereof being electrically interconnected with that said separated magnetizable film in said first plurality thereof having a length greater than its width through an interconnection extending substantially parallel to said width adjacent to that said separated magnetizable film in said first plurality thereof.

15. The apparatus of claim 4 wherein said first and second base magnetizable films each have a length along a selected direction and a width that is smaller in extent than said length, and said first common base electrode and said second common base electrode are separated from one another by a distance less than said width of either.

16. The apparatus of claim 5 wherein two of said separated magnetizable films in said first plurality thereof each have a length along a selected direction and a width that is smaller in extent than said length, and those two said separated magnetizable films are separated from one another by a distance less than said width of either.

17. The apparatus of claim 6 further comprising a first coil spaced apart from said first plurality of separated magnetizable films.

18. The apparatus of claim 7 further comprising a first coil spaced apart from said first plurality of separated magnetizable films.

19. The apparatus of claim 8 wherein said first base magnetizable film has a length along a selected direction and a width that is smaller in extent than said length and has a shaped end portion extending over a portion of said length in which said width gradually reduces to zero at an end thereof.

20. The apparatus of claim 9 wherein whichever of said first base magnetizable film and said first plurality of separated magnetizable films has said magnetization thereof rotated to a smaller angle for said selected external magnetic field present thereat, and has said pinning structure thereon, is formed of a pair of ferromagnetic films separated by a ruthenium film.

21. The apparatus of claim 3 wherein said first plurality of separated magnetizable films are each spaced apart from but located relatively adjacent to a corresponding one of two spatially separated segments of said first coil.

22. The apparatus of claim 13 wherein said first plurality of separated magnetizable films are each spaced apart from but located relatively adjacent to a corresponding one of two spatially separated segments of said first coil, and all of said first plurality of separated magnetizable films are located across said first coil from a single segment of said second coil.

23. The apparatus of claim 15 wherein said first and second base magnetizable films each have a length along a selected direction and a width that is smaller in extent than said length and has a shaped end portion extending over a portion of said length in which said width gradually reduces to zero at an end thereof, said first and second base magnetizable films having said shaped end portions thereof located across from one another.

24. The apparatus of claim 15 further comprising having said first plurality of separated magnetizable films positioned between said first common base electrode and a permeable mass serving as a magnetic field concentrator therefor, and having said second plurality of separated magnetizable films positioned between said second common base electrode and said permeable mass serving as a magnetic field concentrator therefor.

25. The apparatus of claim 24 wherein said first and second base magnetizable films each have a length along a selected direction and a width that is smaller in extent than said length and has a shaped end portion extending over a portion of said length in which said width gradually reduces to zero at an end thereof, said first and second base magnetizable films having said shaped end portions thereof located across from one another.

* * * * *

UNITED STATES PATENT AND TRADEMARK OFFICE
CERTIFICATE OF CORRECTION

| | | |
|---|---|---|
| PATENT NO. | : 6,072,382 | Page 1 of 1 |
| APPLICATION NO. | : 09/226460 | |
| DATED | : June 6, 2000 | |
| INVENTOR(S) | : James M. Daughton et al. | |

It is certified that error appears in the above-identified patent and that said Letters Patent is hereby corrected as shown below:

Column 1, Line 9, insert the following paragraph between Cross-Reference To Related Application paragraph and Background of the Invention:

--This invention was made with Government support under Contract Number N00014-96-C-0342 awarded by the Office of Naval Research. The Government has certain rights in the invention.--

Signed and Sealed this

First Day of July, 2008

JON W. DUDAS
*Director of the United States Patent and Trademark Office*